US012663683B2

(12) United States Patent
Zang et al.

(10) Patent No.: US 12,663,683 B2
(45) Date of Patent: Jun. 23, 2026

(54) DISPLAY SUBSTRATE, DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Pengcheng Zang, Beijing (CN); Yichi Zhang, Beijing (CN); Junlang Tan, Beijing (CN); Yuanming Feng, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/703,812

(22) PCT Filed: Jul. 31, 2023

(86) PCT No.: PCT/CN2023/110334
§ 371 (c)(1),
(2) Date: Apr. 23, 2024

(87) PCT Pub. No.: WO2025/025089
PCT Pub. Date: Feb. 6, 2025

(65) Prior Publication Data
US 2025/0271717 A1     Aug. 28, 2025

(51) Int. Cl.
G02F 1/1368 (2006.01)
G02F 1/1362 (2006.01)
H10D 86/40 (2025.01)

(52) U.S. Cl.
CPC ...... G02F 1/1368 (2013.01); G02F 1/136213 (2013.01); G02F 1/136286 (2013.01); H10D 86/441 (2025.01); H10D 86/481 (2025.01)

(58) Field of Classification Search
CPC ............ G02F 1/1368; G02F 1/136213; G02F 1/136286; H10D 86/441; H10D 86/481
(Continued)

(56) References Cited

U.S. PATENT DOCUMENTS

| 8,018,538 B2 | 9/2011 | Mori et al. |
| 11,581,372 B2 | 2/2023 | Wu et al. |
(Continued)

FOREIGN PATENT DOCUMENTS

| CN | 101285976 A | 10/2008 |
| CN | 110767665 A | 2/2020 |
(Continued)

OTHER PUBLICATIONS

Chinese Office Action for corresponding Chinese Patent Application No. CN 202380009869.X dated Apr. 26, 2026, 10 pages.

*Primary Examiner* — David Y Chung
(74) *Attorney, Agent, or Firm* — Westman, Champlin & Koehler, P.A.

(57) ABSTRACT

The present disclosure provides a display substrate, including sub-pixels, and an $n^{th}$ sub-pixel includes: a transmissive section and a reflective section; and a storage capacitor and a switching transistor in the reflective section. The storage capacitor includes: first to third electrode plates, the first electrode plate is electrically connected to the third electrode plate, the second electrode plate is electrically connected to the switching transistor. An orthographic projection of the first electrode plate overlaps with an orthographic projection of the second electrode plate, and the orthographic projection of the second electrode plate overlaps with an orthographic projection of the third electrode plate. An orthographic projection of the active portion of the switching transistor is spaced apart from the orthographic projection of
(Continued)

the third electrode plate, and the active portion has substantially a same thickness as the third electrode plate.

19 Claims, 18 Drawing Sheets

(58) Field of Classification Search
USPC ..................................... 349/38, 39, 113, 114
See application file for complete search history.

(56) References Cited

U.S. PATENT DOCUMENTS

| | | | |
|---|---|---|---|
| 11,723,246 | B2 | 8/2023 | Zhang et al. |
| 12,057,069 | B2 | 8/2024 | Feng et al. |
| 2005/0173703 | A1 | 8/2005 | Lebrun |
| 2008/0252803 | A1 | 10/2008 | Mori et al. |
| 2009/0115924 | A1 | 5/2009 | Yang et al. |
| 2015/0372025 | A1* | 12/2015 | Misaki ................. H10D 86/441 |
| | | | 257/43 |
| 2021/0202604 | A1 | 7/2021 | Wu et al. |
| 2022/0302240 | A1 | 9/2022 | Zhang et al. |
| 2023/0147751 | A1* | 5/2023 | Kang ................. G02F 1/136213 |
| 2024/0169911 | A1 | 5/2024 | Feng et al. |
| 2024/0241364 | A1 | 7/2024 | Cai et al. |

FOREIGN PATENT DOCUMENTS

| | | |
|---|---|---|
| CN | 113272964 A | 8/2021 |
| CN | 115633521 A | 1/2023 |
| CN | 115707364 A | 2/2023 |
| CN | 219226296 U | 6/2023 |
| CN | 116500774 A | 7/2023 |
| JP | 2009187748 A | 8/2009 |
| KR | 20060098069 A | 9/2006 |
| KR | 20070001564 A | 1/2007 |
| KR | 20080086062 A | 9/2008 |
| WO | 2022226985 A1 | 11/2022 |

* cited by examiner

DISPLAY SUBSTRATE, DISPLAY PANEL AND DISPLAY DEVICE

CROSS-REFERENCE TO RELATED APPLICATION

This application is a Section 371 National Stage Application of International Application No. PCT/CN2023/110334, filed Jul. 31, 2023, entitled "DISPLAY SUBSTRATE, DISPLAY PANEL AND DISPLAY APPARATUS", the contents of which are incorporated herein by reference in their entireties.

TECHNICAL FIELD

The present disclosure relates to a field of display technology, and in particular, to a display substrate, a display panel and a display device.

BACKGROUND

Currently, displays mainly include liquid crystal display (LCD) and organic light-emitting diode (OLED) display. The liquid crystal display usually includes a display substrate, a counter substrate arranged opposite to the display substrate, and a liquid crystal layer between the display substrate and the counter substrate. The liquid crystal display, which may change a rotation direction of liquid crystal molecules in the liquid crystal layer through an electric field generated by a pixel electrode in the display substrate, coordinates with a polarizer to achieve display. The organic light-emitting diode display includes an anode, a cathode, and an organic light-emitting layer arranged between the anode and the cathode. The organic light-emitting diode may generate a current through the anode and cathode, so as to drive the organic light-emitting portion to emit light and realize display.

SUMMARY

The present disclosure provides a display substrate, a display panel and a display device.

According to a first aspect of the present disclosure, a display substrate is provided, including a base substrate, a semiconductor layer, a first conductive layer and a second conductive layer, the second conductive layer being on a side of the first conductive layer away from the base substrate;

the display substrate further includes a plurality of sub-pixels, and an $n^{th}$ sub-pixel of the plurality of sub-pixels includes: a transmissive section and a reflective section located outside the transmissive section;

the $n^{th}$ sub-pixel further includes: a storage capacitor and a switching transistor that are arranged in the reflective section;

the storage capacitor includes: a first electrode plate, a second electrode plate and a third electrode plate, the first electrode plate is in the first conductive layer, the second electrode plate is in the second conductive layer, the third electrode plate is on a side of the second conductive layer away from the base substrate, the first electrode plate is electrically connected to the third electrode plate, the second electrode plate is electrically connected to the switching transistor, and each of the first electrode plate and the third electrode plate is insulated and spaced apart from the second electrode plate;

the switching transistor includes an active portion arranged in the semiconductor layer;

an orthographic projection of the first electrode plate on the base substrate overlaps with an orthographic projection of the second electrode plate on the base substrate, and the orthographic projection of the second electrode plate on the base substrate overlaps with an orthographic projection of the third electrode plate on the base substrate;

an orthographic projection of the active portion on the base substrate is spaced apart from the orthographic projection of the third electrode plate on the base substrate, and the active portion has substantially a same thickness as the third electrode plate; and n is a positive integer.

According to embodiments of the present disclosure, the display substrate further includes a transparent conductive layer and a first insulating layer, the transparent conductive layer is on a side of the second conductive layer away from the base substrate, and the first insulating layer is between the second conductive layer and the transparent conductive layer;

the third electrode plate is in the transparent conductive layer, and the $n^{th}$ sub-pixel further includes a transparent conductive portion in the transparent conductive layer, and the transparent conductive portion is insulated and spaced apart from the third electrode plate;

the transparent conductive portion includes a first sub-portion and a second sub-portion, and the first sub-portion and the second sub-portion are electrically connected;

the first insulating layer is provided with a first via hole passing through the first insulating layer, the first sub-portion is in the transmissive section, the second sub-portion is in the reflective section, an orthographic projection of the second sub-portion on the base substrate and the orthographic projection of the second electrode plate on the base substrate have an overlapping area, and the second sub-portion and the second electrode plate are electrically connected through the first via hole in the overlapping area; and the first electrode plate includes a third sub-portion, an orthographic projection of the third sub-portion on the base substrate at least partially surrounds an orthographic projection of the first via hole on the base substrate, a part of the orthographic projection of the third sub-portion on the base substrate overlaps with the orthographic projection of the second sub-portion on the base substrate, and another part of the orthographic projection of the third sub-portion on the base substrate is spaced apart from the orthographic projection of the second sub-portion on the base substrate.

According to embodiments of the present disclosure, the third sub-portion includes: a first structure and a second structure;

an orthographic projection of the first sub-portion on the base substrate, an orthographic projection of the second sub-portion on the base substrate and an orthographic projection of the active portion on the base substrate are arranged in a first direction, and in a second direction, an orthographic projection of the first structure on the base substrate and an orthographic projection of the second structure on the base substrate are on opposite sides of the orthographic projection of the first via hole on the base substrate, respectively;

an orthographic projection of a part of the first structure proximate to the second structure on the base substrate overlaps with the orthographic projection of the second sub-portion on the base substrate, and an orthographic projection of a part of the first structure away from the second structure on the base substrate is spaced apart from the orthographic projection of the second sub-portion on the base substrate; and/or, an orthographic projection of a part of the second structure proximate to the first structure on the base substrate overlaps with the orthographic projection of the second sub-portion on the base substrate, and an orthographic projection of a part of the second structure away from the first structure on the base substrate is spaced apart from the orthographic projection of the second sub-portion on the base substrate; and the second direction and the first direction intersect with each other.

According to embodiments of the present disclosure, in the first direction, any one of an orthographic projection of the first structure and an orthographic projection of the second structure on the base substrate has a first spacing from the orthographic projection of the first sub-portion on the base substrate, and the orthographic projection of the first via hole on the base substrate has a second spacing from the orthographic projection of the first sub-portion on the base substrate; and the first spacing is smaller than the second spacing.

According to embodiments of the present disclosure, the transparent conductive portion further includes a connecting sub-portion between the first sub-portion and the second sub-portion; and the orthographic projection of the second electrode plate on the base substrate overlaps with an orthographic projection of the connecting sub-portion on the base substrate.

According to embodiments of the present disclosure, the first electrode plate further includes a fourth sub-portion, an orthographic projection of the fourth sub-portion on the base substrate is between the orthographic projection of the second sub-portion on the base substrate and the orthographic projection of the active portion on the base substrate in the first direction, and the orthographic projection of the third sub-portion on the base substrate is on a side of the orthographic projection of the fourth sub-portion on the base substrate proximate to the orthographic projection of the second sub-portion on the base substrate; and the orthographic projection of the third electrode plate on the base substrate overlaps with the orthographic projection of the fourth sub-portion on the base substrate.

According to embodiments of the present disclosure, the display substrate further includes a plurality of data lines arranged in a second direction, an $x^{th}$ data line of the plurality of data lines is electrically connected to the $n^{th}$ sub-pixel;

in the $n^{th}$ sub-pixel, in the second direction, the orthographic projection of the third electrode plate on the base substrate has a third spacing from an orthographic projection of the $x^{th}$ data line on the base substrate, the orthographic projection of the third electrode plate on the base substrate has a fourth spacing from an orthographic projection of an $(x+1)^{th}$ data line on the base substrate, the orthographic projection of the second electrode plate on the base substrate has a fifth spacing from the orthographic projection of the $x^{th}$ data line on the base substrate, and the orthographic projection of the second electrode plate on the base substrate has a sixth spacing from the orthographic projection of the $(x+1)^{th}$ data line on the base substrate;

the third spacing is smaller than the fifth spacing, and the fourth spacing is smaller than the sixth spacing; and each of x and y is a positive integer.

According to embodiments of the present disclosure, in the $n^{th}$ sub-pixel, in the second direction, the orthographic projection of the first electrode plate on the base substrate has a seventh spacing from the orthographic projection of the $x^{th}$ data line on the base substrate, and the orthographic projection of the first electrode plate on the base substrate has an eighth spacing from the orthographic projection of the $(x+1)^{th}$ data line on the base substrate; and the fifth spacing is greater than the seventh spacing, and the sixth spacing is greater than the eighth spacing.

According to embodiments of the present disclosure, the orthographic projection of the third electrode plate on the base substrate and the orthographic projection of the active portion on the base substrate are arranged in a first direction, and in the first direction, the orthographic projection of the third electrode plate on the base substrate has a ninth spacing from the orthographic projection of the active portion on the base substrate;

the orthographic projection of the second electrode plate on the base substrate and the orthographic projection of the active portion on the base substrate are arranged in the first direction, and in the first direction, the orthographic projection of the second electrode plate on the base substrate has a tenth spacing from the orthographic projection of the active portion on the base substrate; and the first direction and the second direction intersect with each other, and the ninth spacing is greater than the tenth spacing.

According to embodiments of the present disclosure, the orthographic projection of the first electrode plate on the base substrate and the orthographic projection of the active portion on the base substrate are arranged in the first direction, and in the first direction, the orthographic projection of the first electrode plate on the base substrate has an eleventh spacing from the orthographic projection of the active portion on the base substrate, and the ninth spacing is smaller than the eleventh spacing.

According to embodiments of the present disclosure, the display substrate further includes a second reflective conductive layer, the second reflective conductive layer is on a side of the transparent conductive layer away from the base substrate;

the $n^{th}$ sub-pixel further includes a reflective portion in the second reflective conductive layer, and the reflective portion is provided with a fourth opening; and an orthographic projection of the reflective portion on the base substrate at least covers an orthographic projection of the active portion on the base substrate and an orthographic projection of the third electrode plate on the base substrate, and an orthographic projection of the fourth opening on the base substrate covers an orthographic projection of the first sub-portion on the base substrate.

According to embodiments of the present disclosure, the display substrate further includes a first reflective conductive layer on a side of the second conductive layer away from the base substrate, and the third electrode plate is provided in the first reflective conductive layer;

the display substrate further includes a plurality of data lines and a plurality of gate lines, the plurality of data lines are arranged in a second direction, the plurality of gate lines are arranged in a first direction, and the first direction and the second direction intersect with each other;

an $x^{th}$ data line of the plurality of data lines is electrically connected to the $n^{th}$ sub-pixel, and a $y^{th}$ gate line of the plurality of gate lines is electrically connected to the $n^{th}$ sub-pixel;

an orthographic projection of at least one of the $x^{th}$ data line, an $(x+1)^{th}$ data line, a $(y-1)^{th}$ gate line, and the $y^{th}$ gate line on the base substrate overlaps with an orthographic projection of the third electrode plate of the $n^{th}$ sub-pixel on the base substrate; and each of x and y is a positive integer.

According to embodiments of the present disclosure, the display substrate further includes a transparent conductive layer and a first insulating layer, the transparent conductive layer is on a side of the first reflective conductive layer away from the base substrate, and the first insulating layer is between the second conductive layer and the transparent conductive layer;

the $n^{th}$ sub-pixel further includes a transparent conductive portion, and the transparent conductive portion is provided in the transparent conductive layer;

the transparent conductive portion includes a first sub-portion and a second sub-portion that are electrically connected;

the first insulating layer is provided with a first via hole passing through the first insulating layer, the first sub-portion is in the transmissive section, the second sub-portion is in the reflective section, an orthographic projection of the second sub-portion on the base substrate and the orthographic projection of the second electrode plate on the base substrate have an overlapping area, and the second sub-portion and the second electrode plate are electrically connected through the first via hole in the overlapping area; and the third electrode plate is provided with a first opening and a second opening, an orthographic projection of the first opening on the base substrate covers an orthographic projection of the transmissive section on the base substrate, and an orthographic projection of the second opening on the base substrate covers an orthographic projection of the first via hole on the base substrate.

According to embodiments of the present disclosure, the third electrode plate is further provided with a third opening, and an orthographic projection of the third opening on the base substrate covers the orthographic projection of the active portion on the base substrate;

in the second direction, the first opening has a first size, the second opening has a second size, and the third opening has a third size; and the third size is smaller than the first size and is greater than the second size.

According to embodiments of the present disclosure, an orthographic projection of the first electrode plate on the base substrate overlaps with an orthographic projection of the second sub-portion on the base substrate, and the orthographic projection of the first electrode plate on the base substrate is on a side of the orthographic projection of the first via hole on the base substrate away from the first sub-portion.

According to embodiments of the present disclosure, the first sub-portion and the second sub-portion have substantially a same size in the second direction.

According to embodiments of the present disclosure, the display substrate further includes a second reflective conductive layer, the second reflective conductive layer is on the side of the first reflective conductive layer away from the base substrate;

the $n^{th}$ sub-pixel further includes a reflective portion in the second reflective conductive layer, an orthographic projection of the reflective portion on the base substrate covers an orthographic projection of the second opening on the base substrate and an orthographic projection of the third opening on the base substrate, the reflective portion is further provided with a fourth opening, and an orthographic projection of the fourth opening on the base substrate covers the transmissive section; and the reflective portion is electrically connected to the first sub-portion at an edge of the fourth opening.

According to embodiments of the present disclosure, a size of the fourth opening in the second direction is greater than or equal to a size of the fourth opening in the first direction.

According to embodiments of the present disclosure, the display substrate further includes a display area and a peripheral area at least partially surrounding the display area, the plurality of sub-pixels are provided in the display area;

the display substrate further includes a plurality of first connection lines, a plurality of second connection lines and at least one common signal line, the plurality of first connection lines are arranged in the first direction, and the plurality of second connection lines are arranged in the first direction;

in the $n^{th}$ sub-pixel, the third electrode plate is electrically connected to an $i^{th}$ first connection line of the plurality of first connection lines, and the first electrode plate is electrically connected to a $j^{th}$ second connection line of the plurality of second connection lines, and the $i^{th}$ first connection line and the $j^{th}$ second connection line are electrically connected to the common signal line in the peripheral area; and each of i and j is a positive integer.

According to embodiments of the present disclosure, in the reflective section, the orthographic projection of the active portion on the base substrate and the orthographic projection of the third electrode plate on the base substrate form complementary patterns.

According to a second aspect of the present disclosure, a display panel is provided, including a display substrate and a counter substrate, the display substrate includes the display substrate described above, the counter substrate includes a plurality of color resistors, and an $m^{th}$ color resistor of the plurality of color resistors is arranged to face the $n^{th}$ sub-pixel;

an $m^{th}$ color resistor of the plurality of color resistors includes a first region, a second region and a third region, an orthographic projection of the first region on the base substrate covers an orthographic projection of the transmissive section of the $n^{th}$ sub-pixel on the base substrate, an orthographic projection of the third region on the base substrate covers an orthographic projection of the active portion of the $n^{th}$ sub-pixel on the base substrate, and in a first direction, the second region is between the first region and the third region;

a size of the second region is smaller than or equal to a size of the third region in a second direction, and the second direction and the first direction intersect with each other; and m is a positive integer.

According to embodiments of the present disclosure, the plurality of color resistors include a first color resistor, a second color resistor and a third color resistor, the first color resistor, the second color resistor and the third color resistor have different colors, an orthographic projection of the first color resistor on the base substrate, an orthographic projection of the second color resistor on the base substrate and an orthographic projection of the third color resistor on the base substrate are spaced apart from each other; and in the second direction, a second region of the first color resistor has a fourth size, a second region of the second color resistor has a fifth size, a second region of the third color resistor has a sixth size, and the fifth size is greater than the fourth size and is smaller than the sixth size.

According to embodiments of the present disclosure, the display panel further includes a liquid crystal layer, the liquid crystal layer including a plurality of dimming areas, a $z^{th}$ dimming area of the plurality of dimming areas is arranged to face the $n^{th}$ sub-pixel; and the $z^{th}$ dimming area includes a first dimming sub-area and a second dimming sub-area, an orthographic projection of the first dimming sub-area on the base substrate covers an orthographic projection of the transmissive section of the $n^{th}$ sub-pixel on the base substrate, an orthographic projection of the second dimming sub-area on the base substrate covers an orthographic projection of the reflective section of the $n^{th}$ sub-pixel on the base substrate, and a cell thickness of the first dimming sub-area is greater than a cell thickness of the second dimming sub-area.

According to a second aspect of the present disclosure, a display device is provided, including the display panel described above.

BRIEF DESCRIPTION OF THE DRAWINGS

By describing embodiments of the present disclosure with reference to the drawings, the objectives, features and advantages of the present disclosure will become more apparent.

DETAILED DESCRIPTION OF EMBODIMENTS

Figure 1A:
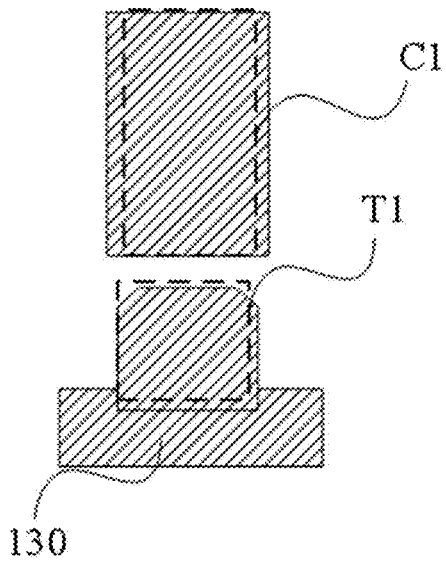
FIGS. 1A to 1E schematically show top views of a sub-pixel of a display substrate in an example.

In order to make the purpose, technical solutions and advantages of the embodiments of the present disclosure apparent, the technical solutions in the embodiments of the present disclosure will be clearly and completely described in conjunction with the drawings in the embodiments of the present disclosure. The affirmatively described embodiments constitute only a subset of the embodiments contemplated in view of the present disclosure, and not all of such embodiments. Based on the described embodiments of the present disclosure, further embodiments obtained by those skilled in the art without creative work are within the protection scope of the present disclosure.

It will be noted that, in the drawings, for clarity and/or description purposes, a size and relative size of an element may be enlarged, the size and relative size of each element need not be limited to those shown in the drawings. In the specification and drawings, the same or similar reference numerals indicate the same or similar components.

When an element is described as being "on", "connected to" or "coupled to" another element, the element may be directly on the another element, directly connected to the another element or directly coupled to the another element, or an intermediate element may be present. However, when an element is described as being "directly on", "directly connected to" or "directly coupled to" another element, there are no intermediate element. Other terms and/or expressions used to describe the relationship between elements will be interpreted in a similar manner, for example, "between" and "directly between", "adjacent" and "directly adjacent", "on" and "directly on" etc. In addition, the term "connect" may refer to a physical connection, an electrical connection, a communication connection, and/or a fluid connection. In addition, X axis, Y axis, and Z axis are not limited to the three axes of the Cartesian coordinate system, which may be interpreted in broader meaning. For example, the X axis, the Y axis, and the Z axis may be perpendicular to each other, or may represent different directions that are not perpendicular to each other. For the purpose of the present disclosure, "at least one of X, Y, and Z" and "at least one selected from a group consisting of X, Y, and Z" may be interpreted as only X, only Y, only Z, or any combination of two or more of X, Y, and Z such as XYZ, XYY, YZ, and ZZ. As shown in the present disclosure, the term "and/or" includes any and all combinations of one or more of the related items.

It will be noted that although the terms "first", "second", etc. may be used to describe various components, members, elements, regions, layers and/or portions, these components, components, elements, regions, layers and/or portions should not be limited by these terms. Actually, the terms are used to distinguish one component, member, element, region, layer, and/or portion from another one. Thus, for example, a first component, a first member, a first element, a first region, a first layer, and/or a first portion described below may be referred to as a second component, a second member, a second element, a second region, a second layer and/or a second portion, which does not depart from the teachings of this disclosure.

For the convenience of description, the spatial relationship terms, for example, "upper", "lower", "left", "right", etc. may be used to describe the relationship between one element or feature and another element or feature as shown in figures. It will be understood that, in addition to an orientation described in figures, the spatial relationship terms include other different orientations of a device in operation. For example, if the device in figures is turned upside down, elements described as "below" or "lower" other elements or features will be oriented "on" or "upper" other elements or features.

In the present disclosure, the terms "substantially", "approximately", "circa", "about" and other similar terms are used as approximate terms rather than as terms of degree, and these terms explain an inherent deviation of a measured value or a calculated value recognized by those skilled in the art. Taking into factors such as process fluctuations, measurement problems, and errors related to the measurement of specific quantities (i.e. the limitations of the measurement system), the "substantially" or "approximately" includes a stated value and means that a specific value determined by those skilled in the art is within an acceptable deviation range. For example, "approximately" may mean within one or more standard deviations, or within ±30%, ±20%, ±10%, ±5% of the stated value.

It will be noted that, in the present disclosure, the expression "same layer" refers to a film layer formed by the same film forming process, the film layer is used to form a specific pattern, and then the same mask is used to pattern the film layer and form a layer structure through one patterning process. Depending on the specific pattern, the one patterning process may include multiple exposure, development or etching processes and the specific pattern in the formed layer structure may be continuous or discontinuous. That is, a plurality of elements, components, structures and/or portions in the "same layer" are made of the same material and formed by the same patterning process. Generally, the plurality of elements, components, structures and/or portions in the "same layer" have approximately the same thickness.

Those skilled in the art should understand that, in the present disclosure, unless otherwise specified, the expression "height" or "thickness" refers to a size along a surface of each film layer arranged perpendicular to a display substrate, that is, the size in a light-emission direction of the display substrate, or the size in a normal direction of the display device.

At present, liquid crystal displays may be divided into a transmissive liquid crystal display, a reflective liquid crystal display and a transflective liquid crystal display. The transmissive liquid crystal display uses a backlight module as a light source, and light emitted by the backlight module passes through a liquid crystal layer and a polarizer, so as to display images. The transmissive liquid crystal display may realize image display in a dark environment, but an image displayed in a bright environment is unclear. The reflective liquid crystal display uses external environmental light as the light source. The external environmental light enters the reflective liquid crystal display and then is reflected, so as to display images. The reflective liquid crystal display may achieve clear display in a bright environment, but fails to display images in a dark environment. The transflective liquid crystal display has the characteristics of both the transmissive liquid crystal display and the reflective liquid crystal display, and is provided with both a transmissive section and a reflective section within the display, so that it may be used in both a bright environment and a dark environment.

In an example, a transflective liquid crystal display is provided. The transflective liquid crystal display in this example may switch between reflective display and transmissive display. During the reflective display, external environmental light is used as the light source, and during the transmissive display, a backlight module is used as the light source.

Figure 1B:
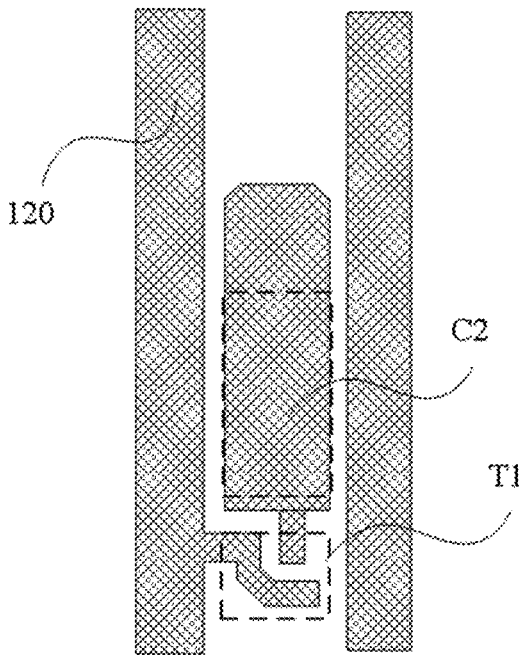
Figure 1C:
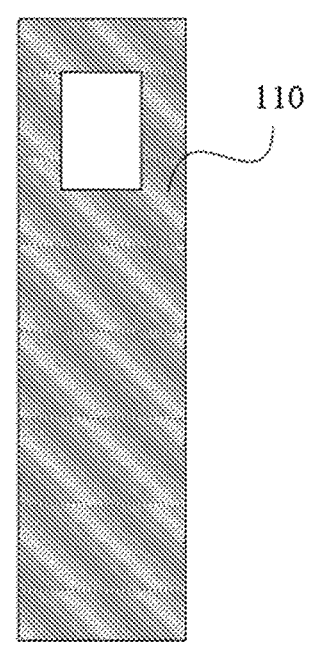
Figure 1D:
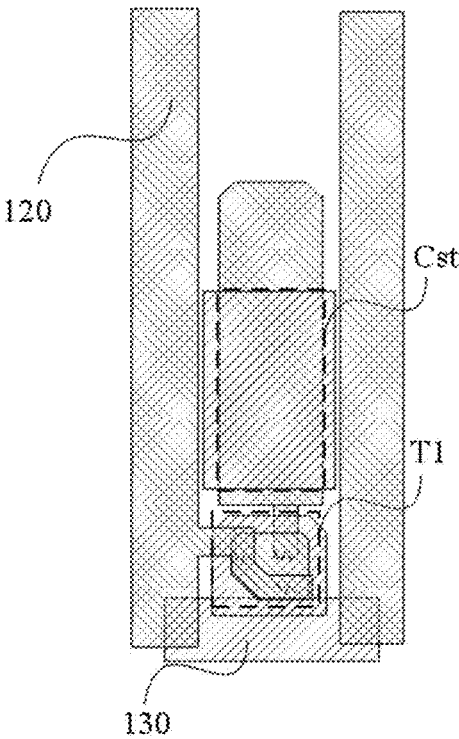
Figure 1E:
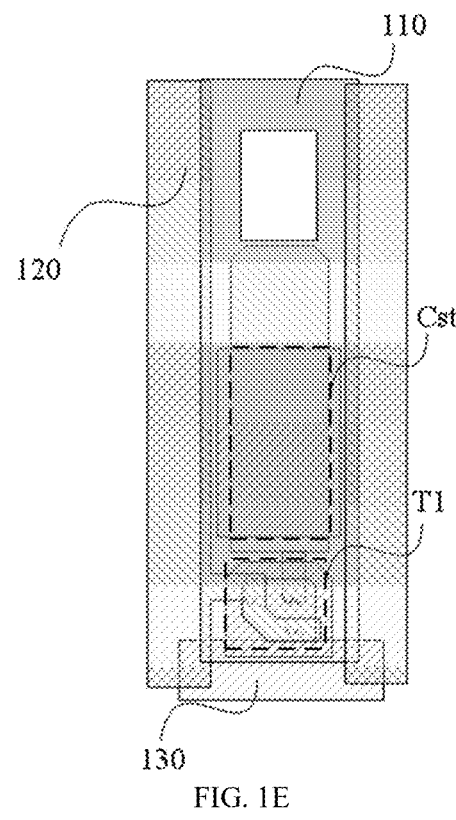

The transflective liquid crystal display in this example includes a display substrate and a counter substrate. FIGS. 1A to 1E schematically show top views of a sub-pixel of a display substrate in the example. FIG. 1A schematically shows a top view of a first conductive layer in the example, FIG. 1B schematically shows a top view of a second conductive layer in the example, FIG. 1C schematically shows a top view of a reflective layer in the example, FIG. 1D schematically shows a top view of a first conductive layer and a second conductive layer in the example, and FIG. 1E schematically shows a top view of a first conductive layer, a second conductive layer and a reflective layer in the example.

Referring to FIGS. 1A to 1E, the display substrate includes a plurality of sub-pixels, at least one sub-pixel includes a reflective portion 110, and the reflective portion 110 is provided in a reflective layer. The reflective portion 110 is used to reflect environmental light during reflective display and to prevent light leakage during the transmissive display. In this example, at least part of a black matrix in the counter substrate is removed, a width of a data line 120 and a width of a gate line 130 in the display substrate are increased, and the data line 120 and the gate line 130 may be used to reflect light. In this way, a reflective section during the reflective display may be increased, so that the aperture ratio during reflective display may be improved. In addition, the data line 120 and the gate line 130 may overlap with the reflective portion 110 in the display substrate, so as to replace the removed black matrix and achieve a light-shielding function during the transmissive display, so that light leakage does not occur during transmissive display.

In this example, at least one sub-pixel includes a switching transistor T1 and a storage capacitor Cst. Due to the pixel structure of the sub-pixel, there is an inevitable jump voltage $\Delta Vp$ caused by a coupling capacitance and a change of a gate voltage from a high potential to a low potential. The theoretical equation of the jump voltage $\Delta Vp$ is as follows:

$$\Delta Vp = Cgs * (Vgh - Vg1)/(Cgs + Cst + Clc).$$

Here, $\Delta Vp$ represents the jump voltage, Vgh represents a high gate voltage of the switching transistor T1, Vg1 represents a low gate voltage of the switching transistor T1, and Clc represents a liquid crystal capacitance. Generally, Cgs represents a capacitance formed by a gate, a source of the switching transistor T1, and a gate insulating layer between the gate and the source, and Cst represents a storage capacitance Cst formed by a pixel electrode, a common electrode, and an insulating layer between the pixel electrode and the common electrode.

Due to the influence of liquid crystal characteristics, there is a large difference between the maximum liquid crystal capacitance Clcmax and the minimum liquid crystal capacitance Clcmin. Accordingly, a difference $\Omega$ between the maximum value of the jump voltage Vpmax and the minimum value of the jump voltage $\Delta Vpmin$ is large. When the difference $\Omega$ is greater than 0.5, the display has an unacceptable flicker thereon.

In order to reduce the difference $\Omega$, the capacitance of the storage capacitor Cst may be increased. However, in order to adapt to high resolution requirements, a size of a sub-pixel in the display substrate is getting smaller and smaller, and an area of the storage capacitor Cst in the sub-pixel is accordingly getting smaller and smaller. In the above example, since the width of the data line 120 and the width of the gate line 130 are increased, the area of the storage capacitor Cst is further limited and decreased. The area of the storage capacitor Cst is positively related to the capacitance of the storage capacitor Cst, and thus the decrease of the area of the storage capacitor Cst directly leads to a decrease of the capacitance of the storage capacitor Cst. In this example, since the area of the storage capacitor Cst is greatly limited and decreased, the capacitance of the storage capacitor Cst may not meet the requirement of reducing the difference $\Omega$.

In view of this, the embodiments of the present disclosure provide a display substrate, including: a base substrate, a semiconductor layer, a first conductive layer, and a second conductive layer, where the second conductive layer is on a side of the first conductive layer away from the base substrate. The display substrate further includes a plurality of sub-pixels, and an $n^{th}$ sub-pixel of the plurality of sub-pixels includes: a transmissive section and a reflective section outside the transmissive section, where n is a positive integer. The $n^{th}$ sub-pixel further includes: a storage capacitor and a switching transistor that are arranged in the reflective section. The storage capacitor includes: a first electrode plate, a second electrode plate and a third electrode plate, where the first electrode plate is in the first conductive layer, the second electrode plate is in the second conductive layer, the third electrode plate is on a side of the second conductive layer away from the base substrate. The first electrode plate is electrically connected to the third electrode plate, the second electrode plate is electrically connected to the switching transistor, and each of the first electrode plate and the third electrode plate is insulated and spaced apart from the second electrode plate. The switching transistor includes an active portion arranged in the semiconductor layer. An orthographic projection of the first electrode plate on the base substrate overlaps with an orthographic projection of the second electrode plate on the base substrate, and the orthographic projection of the second electrode plate on the base substrate overlaps with an orthographic projection of the third electrode plate on the base substrate. An orthographic projection of the active portion on the base substrate is spaced apart from the orthographic projection of the third electrode plate on the base substrate, and the active portion has substantially a same thickness as the third electrode plate.

In this way, the capacitance of the storage capacitor may be increased, so that the difference $\Omega$ of the storage capacitor may be effectively reduced. In addition, the storage capacitor is changed only by a small size in a horizontal direction, or a size of the storage capacitor in the horizontal direction is even unchanged, which is beneficial to a design of the sub-pixel with a small size. Furthermore, the third electrode plate is spaced apart from the active portion, and the third electrode plate and the active portion have substantially the same thickness, so that a step difference of film layers caused by the active portion may be reduced or even eliminated. In this way, a reflective surface in the reflective section may be flat, so that the reflection efficiency of the reflective section may be improved.

Figure 2:
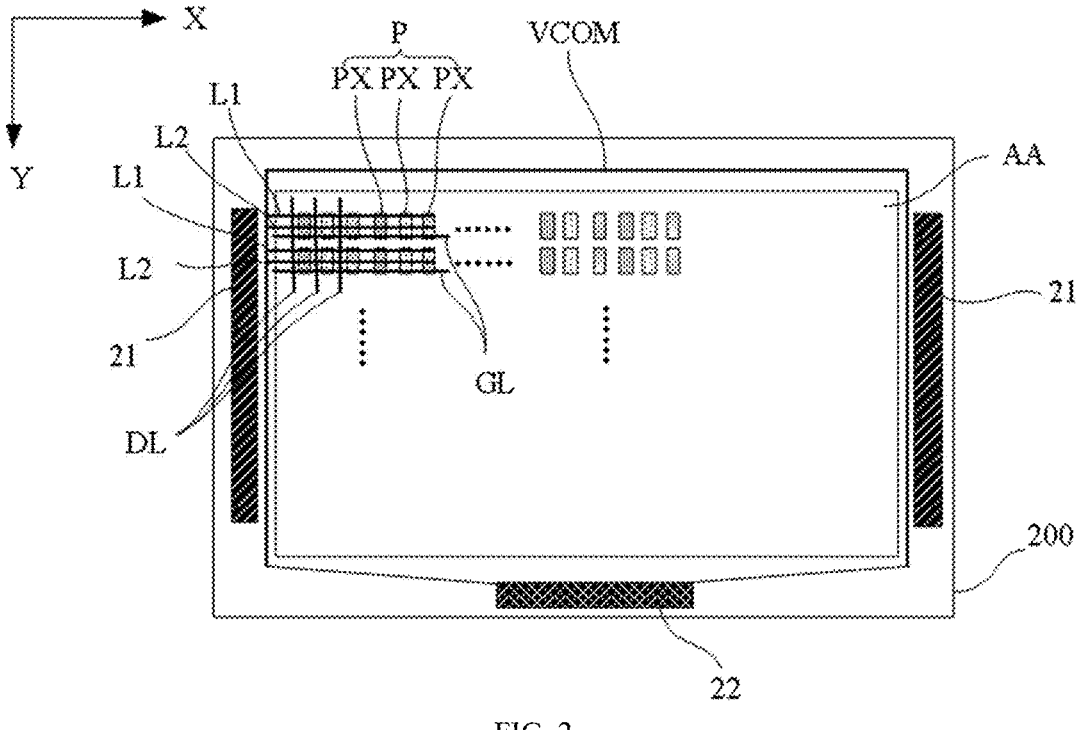
FIG. 2 schematically shows a top view of a display substrate according to an embodiment of the present disclosure.

FIG. 2 schematically shows a top view of a display substrate according to an embodiment of the present disclosure.

Referring to FIG. 2, the display substrate in the embodiments of the present disclosure includes: a display area AA and a peripheral area NA on at least one side of the display area AA.

The display area AA may have various shapes. For example, the display area AA may be provided in various shapes, such as a closed-shaped polygon including straight edges (for example, a rectangle), a circle or an ellipse including a curved edge, or a semicircle or semi ellipse including both a straight edge and a curved edge. In the embodiments of the present disclosure, the display area AA is provided as an area having a shape of a quadrilateral including straight edges. It will be understood that this is only an exemplary embodiment of the present disclosure and is not a limitation to the present disclosure.

The display substrate may further include a base substrate 200 and a plurality of pixel units P arranged on the base substrate 200 and in the display area AA. The plurality of pixel units P may be arranged in an array in a first direction Y and a second direction X. Each pixel unit P may include a plurality of sub-pixels PX. For example, the pixel unit P may include a first sub-pixel, a second sub-pixel and a third sub-pixel. Exemplarily, the first sub-pixel, the second sub-pixel and the third sub-pixel may be provided as a red sub-pixel, a green sub-pixel and a blue sub-pixel, respectively. However, the embodiments of the present disclosure are not limited thereto.

The display substrate further includes a plurality of gate lines GL and a plurality of data lines DL arranged on the base substrate 200 and located at least in the display area AA. The plurality of gate lines GL extend in the second direction X, and the plurality of data lines DL extend in the first direction Y. For example, a sub-pixel PX is connected to a respective data line DL and a respective gate line GL. Sub-pixels PX in a same row are connected to a same gate line GL, and sub-pixels PX in different rows are connected to different gate lines GL. Sub-pixels PX in a same column are connected to a same data line DL, and sub-pixels PX in different columns are connected to different data lines DL.

The peripheral area NA may be arranged on at least one side of the display area AA. For example, the peripheral area NA may surround a periphery of the display area AA. In the embodiments of the present disclosure, the peripheral area NA may include a longitudinal portion extending in the first direction Y and a transverse portion extending in the second direction X.

The display substrate may further include a gate driver circuit 21 and a driver chip 22 arranged on the base substrate 200 and in the peripheral area NA. For example, the gate driver circuit 21 may be provided on at least one side of the display area AA. In the embodiment shown in FIG. 2, gate driver circuits 21 are provided on left and right sides of the display area AA, respectively. It will be noted that the left and right sides may be left and right sides of the display substrate (screen) viewed by human eyes during display. For example, the driver chip 22 may be provided on at least one side of the display area AA. In the embodiment shown in FIG. 2, the driver chip 22 is provided on a lower side of the display area AA. It will be noted that the lower side may be a lower side of the display substrate (screen) viewed by human eyes during display.

The driver chip 22 includes a data driver circuit. The data driver circuit is used to sequentially latch input data periodically according to clock signals and convert the latched data into analog signals, and then input the analog signals to the data lines DL of the display substrate. The gate driver circuit 21 is generally implemented by a shift register. The shift register converts the clock signals into on/off voltages and outputs the on/off voltages to the gate lines GL of the display substrate, respectively.

It will be noted that FIG. 2 shows that the gate driver circuits 21 are on the left and right sides of the display area AA, and the driver chip 22 is on the lower side of the display area AA, however, the embodiments of the present disclosure are not limited thereto. The gate driver circuit 21 and the driver chip 22 may be provided at any suitable locations in the peripheral area NA.

For example, a GOA technology, namely Gate Driver on Array, may be applied to the gate driver circuit 21. According to the GOA technology, the gate driver circuit 21 is provided directly on the array substrate to replace an external chip. Each GOA unit serves as a stage of shift register, and each stage of shift register is connected to a gate line GL. Scanning signals are sequentially output through the respective stages of shift registers, so as to achieve progressive scanning of the pixel units. In some embodiments, each stage of the shift register may also be connected to a plurality of gate lines GL. In this way, it may adapt to a development trend of high resolution and narrow bezel of display substrates. The driver chip 22 may be folded to a back side of the display substrate using a structure such as a chip on film.

The display substrate according to the embodiments of the present disclosure will be described in detail below with reference to FIGS. 2 to 29.

Figure 3:
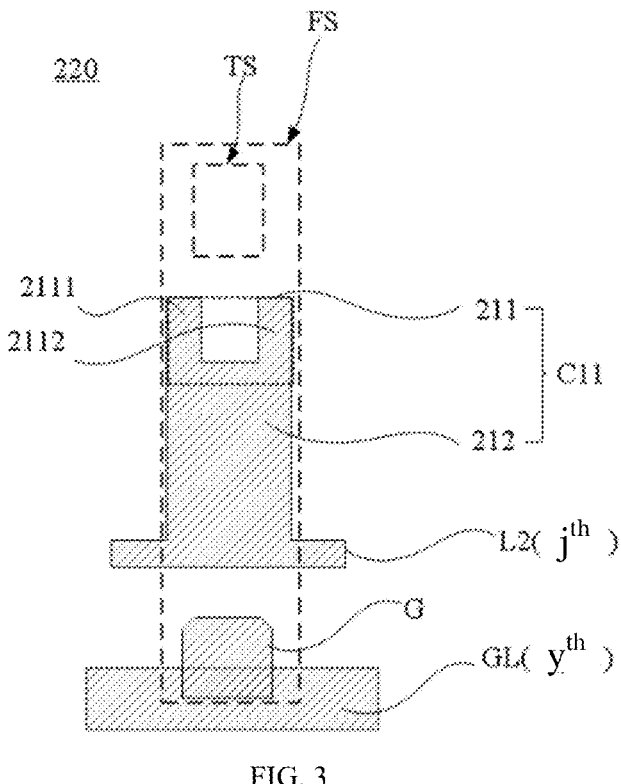
FIG. 3 schematically shows a top view of a first conductive layer according to some embodiments of the present disclosure.
Figure 4:
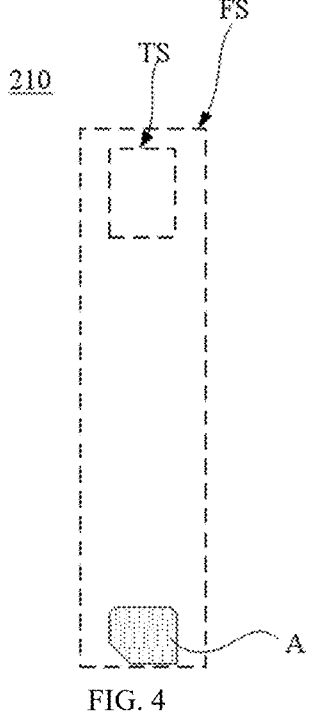
FIG. 4 schematically shows a top view of a semiconductor layer according to some embodiments of the present disclosure.
Figure 5:
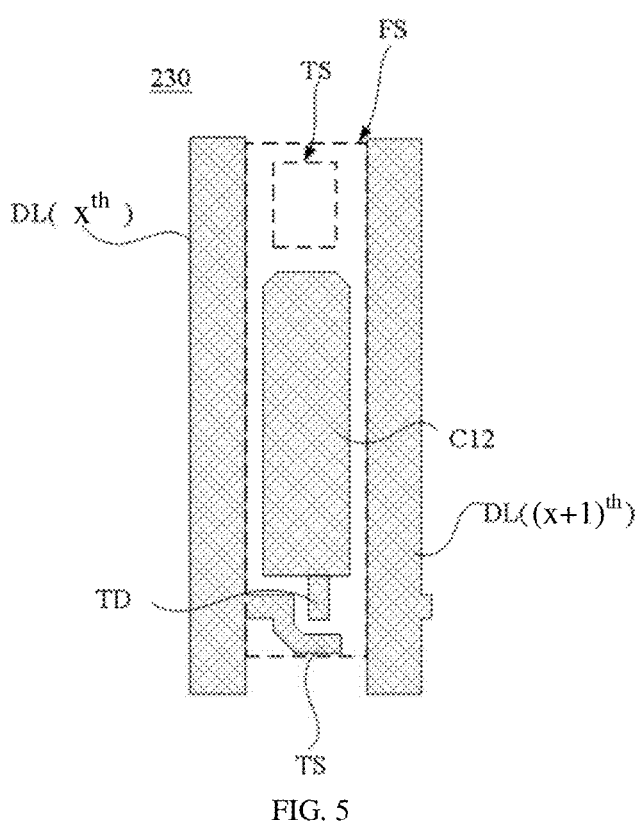
FIG. 5 schematically shows a top view of a second conductive layer according to some embodiments of the present disclosure.
Figure 6:
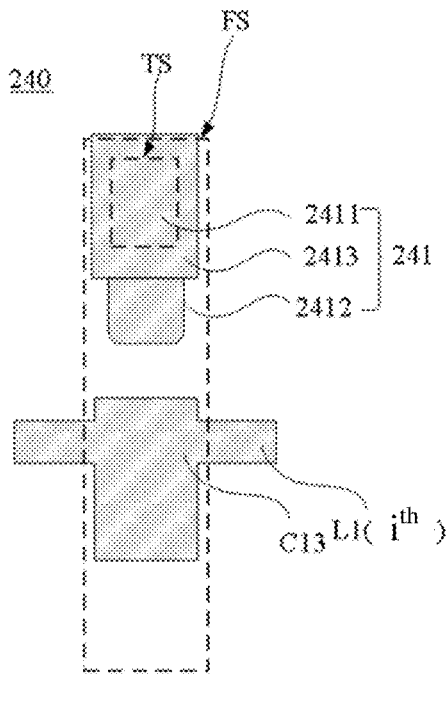
FIG. 6 schematically shows a top view of a transparent conductive layer according to some embodiments of the present disclosure.
Figure 7:
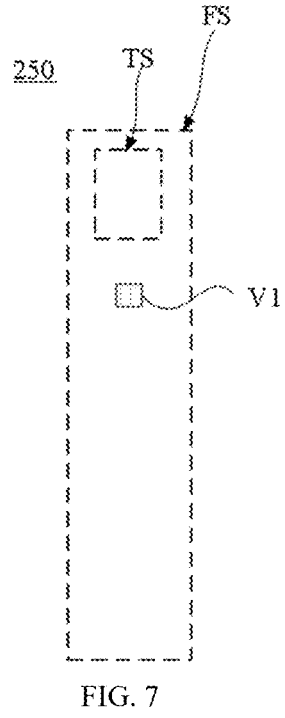
FIG. 7 schematically shows a top view of a first insulating layer according to some embodiments of the present disclosure.
Figure 8:
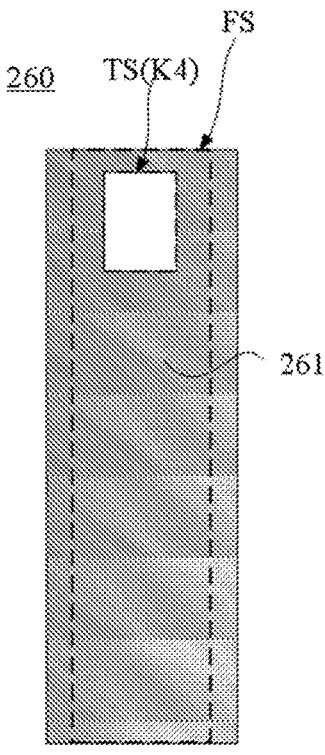
FIG. 8 schematically shows a top view of a second reflective conductive layer according to some embodiments of the present disclosure.
Figure 9:
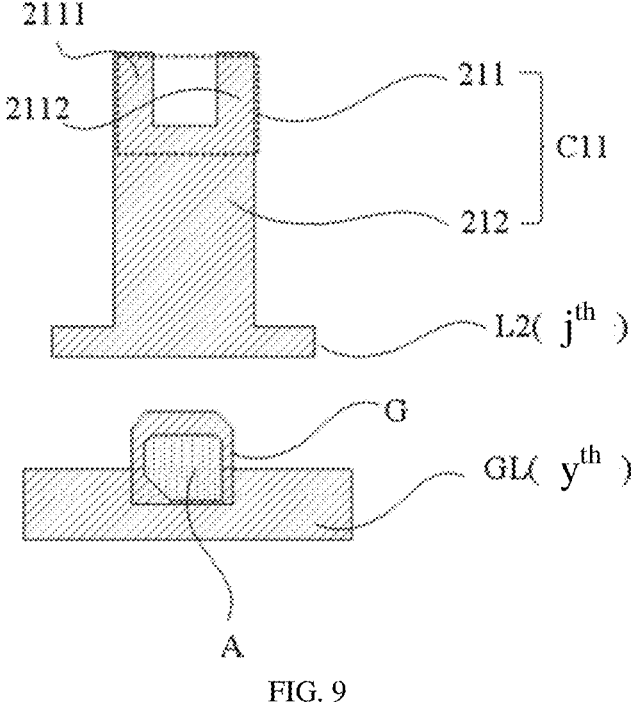
FIG. 9 schematically shows a top view of a first conductive layer and a semiconductor layer according to some embodiments of the present disclosure.
Figure 10:
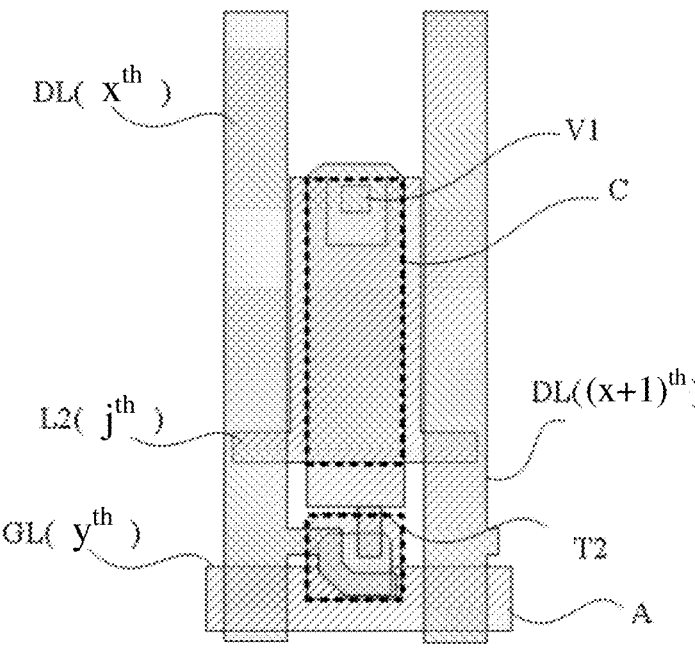
FIG. 10 schematically shows a top view of a first conductive layer, a semiconductor layer, a second conductive layer and a first insulating layer according to some embodiments of the present disclosure.
Figure 11:
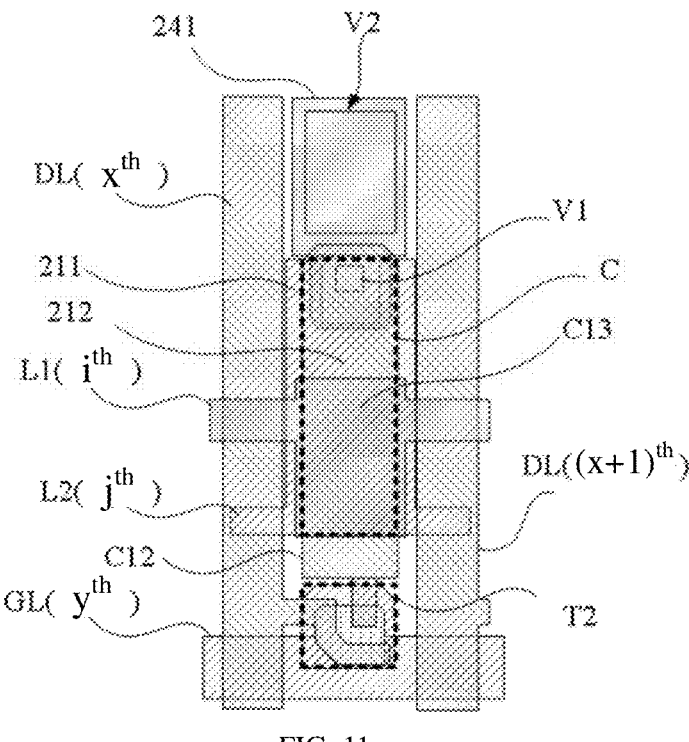
FIG. 11 schematically shows a top view of a first conductive layer, a semiconductor layer, a second conductive layer, a first insulating layer and a transparent conductive layer according to some embodiments of the present disclosure.
Figure 12:
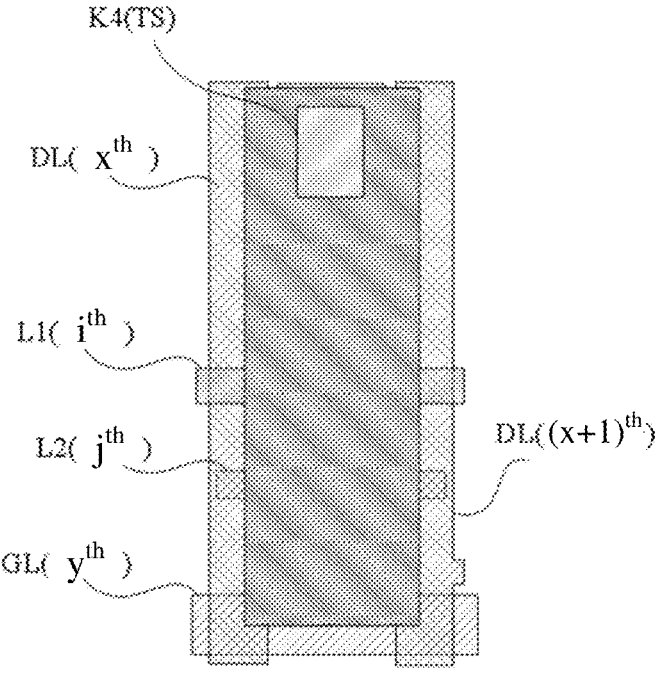
FIG. 12 schematically shows a top view of a first conductive layer, a semiconductor layer, a second conductive layer, a first insulating layer, a transparent conductive layer and a second reflective conductive layer according to some embodiments of the present disclosure.
Figure 13:
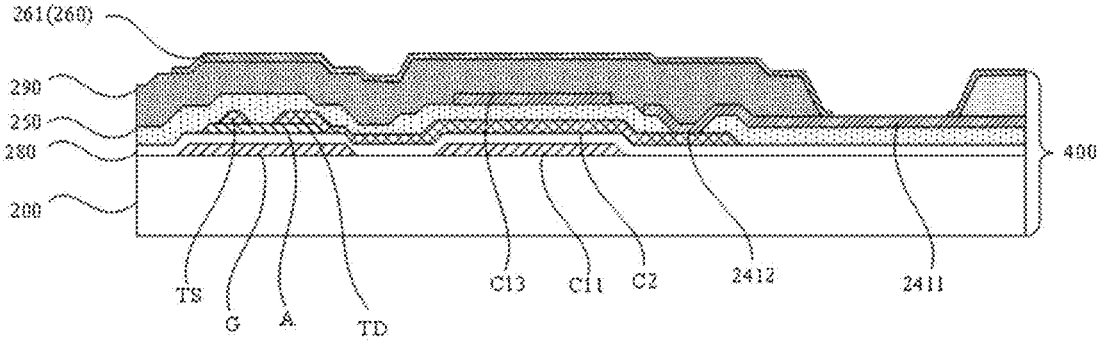
FIG. 13 schematically shows a cross-sectional view of a sub-pixel according to some embodiments of the present disclosure.

FIGS. 3 to 12 schematically show top views of a sub-pixel according to some embodiments of the disclosure, and FIG. 13 schematically shows a cross-sectional view of a sub-pixel according to some embodiments of the disclosure. FIG. 3 schematically shows a top view of a first conductive layer according to some embodiments of the present disclosure, FIG. 4 schematically shows a top view of a semiconductor layer according to some embodiments of the present disclosure, FIG. 5 schematically shows a top view of a second conductive layer according to some embodiments of the present disclosure, FIG. 6 schematically shows a top view of a transparent conductive layer according to some embodiments of the present disclosure, FIG. 7 schematically shows a top view of a first insulating layer according to some embodiments of the present disclosure, FIG. 8 schematically shows a top view of a second reflective conductive layer according to some embodiments of the present disclosure, FIG. 9 schematically shows a top view of a first conductive layer and a semiconductor layer according to some embodiments of the present disclosure, FIG. 10 schematically shows a top view of a first conductive layer, a semiconductor layer, a second conductive layer and a first insulating layer according to some embodiments of the present disclosure, FIG. 11 schematically shows a top view of a first conductive layer, a semiconductor layer, a second conductive layer, a first insulating layer and a transparent conductive layer according to some embodiments of the present disclosure, and FIG. 12 schematically shows a top view of a first conductive layer, a semiconductor layer, a second conductive layer, a first insulating layer, a transparent conductive layer and a second reflective conductive layer according to some embodiments of the present disclosure.

Referring to FIGS. 2 to 13, the display substrate of the embodiments of the present disclosure further includes: a semiconductor layer 210, a first conductive layer 220 and a second conductive layer 230. The second conductive layer 230 is on a side of the first conductive layer 220 away from the base substrate.

A material of the semiconductor layer 210 may include amorphous silicon, polysilicon, oxide semiconductor, or the like, and a material of the first conductive layer 220 may include a metal material. For example, the material of the first conductive layer 220 may include metal such as Mo, Al, Cu and their alloys, or a material such as Ti/Al/Ti. Optionally, the plurality of gate lines GL may be provided in the first conductive layer 220. The material of the second conductive layer 230 may include a metal material. For example, the material of the second conductive layer 230 may include metal such as Mo, Al, Cu and their alloys, or a material such as Ti/Al/Ti. Optionally, the plurality of data lines DL may be provided in the second conductive layer 230.

The display substrate of the embodiment of the present disclosure is used in a transflective display. An $n^{th}$ sub-pixel PX of the plurality of sub-pixels PX includes: a transmissive section TS and a reflective section FS located outside the transmissive section TS. The $n^{th}$ sub-pixel PX further includes: a storage capacitor C and a switching transistor T2 that are arranged in the reflective section FS, where n is a positive integer.

The $n^{th}$ sub-pixel PX may refer to any one of the plurality of sub-pixels PX. That is, in embodiments of the present disclosure, any one of the plurality of sub-pixels PX may include the reflective section FS, the transmissive section TS, and the storage capacitor C and the switching transistor T2 in the reflective section FS. The reflective section FS is used to reflect environmental light during the reflective display, while the transmissive section TS is used to allow the light emitted by the backlight module to pass through during the transmissive display.

The transmissive section TS and the reflective section FS may have various shapes. For example, the transmissive section TS and the reflective section FS may be provided in various shapes, such as a closed-shaped polygon including straight edges (i.e. a rectangle), a circle or an ellipse including a curved edge, or a semicircle or semi ellipse including both a straight edge and a curved edge, and a semi ellipse. In the embodiments of the present disclosure, the transmissive section TS and the reflective section FS are provided as areas having a shape of a quadrilateral including straight edges. It will be understood that this is only an exemplary embodiment of the present disclosure, rather than a limitation to the present disclosure. For example, alternatively, the reflective section FS may also at least partially surround the transmissive section TS.

Optionally, the transmissive section TS and the reflective section FS are arranged in the first direction Y, and the $n^{th}$ sub-pixel PX is electrically connected to a $y^{th}$ gate line GL. In the $n^{th}$ sub-pixel PX, an orthographic projection of the transmissive section TS on the base substrate 200 is on a side of an orthographic projection of the reflective section FS on the base substrate 200 away from the $y^{th}$ gate line GL. In other words, the reflective section FS is closer to the $y^{th}$ gate line GL than the transmissive section TS. Alternatively, the reflective section FS may also be arranged around the transmissive section TS, specifically, it may be determined according to actual needs, and the embodiments of the present disclosure do not limit this.

For ease of clarity, unless otherwise specified, the following descriptions take one sub-pixel PX (namely the $n^{th}$ sub-pixel PX) and a signal line electrically connected to this sub-pixel PX as an example.

In the $n^{th}$ sub-pixel PX, the storage capacitor C includes: a first electrode plate C11, a second electrode plate C12 and a third electrode plate C13. The first electrode plate C11 is in the first conductive layer 220, the second electrode plate C12 is in the second conductive layer 230, and the third electrode plate C13 is on a side of the second conductive layer 230 away from the base substrate 200. The first electrode plate C11 is electrically connected to the third electrode plate C13, the second electrode plate C12 is electrically connected to the switching transistor T2, and each of the first electrode plate C11 and the third electrode plate C13 is insulated and spaced apart from the second electrode plate C12. The switching transistor T2 includes an active portion A arranged in the semiconductor layer 210. An orthographic projection of the first electrode plate C11 on the base substrate 200 overlaps with an orthographic projection of the second electrode plate C12 on the base substrate 200, and the orthographic projection of the second electrode plate C12 on the base substrate 200 overlaps with an orthographic projection of the third electrode plate C13 on the base substrate 200.

The first electrode plate C11 is closer to the base substrate 200 than the second electrode plate C12, and the second electrode plate C12 is closer to the base substrate 200 than the third electrode plate C13. In other words, in a thickness direction of the display substrate, the first electrode plate C11 and the third electrode plate C13 are arranged on two sides of the second electrode plate C12. The first electrode plate C11 and the third electrode plate C13 are electrically connected, thereby jointly forming a first terminal of the storage capacitor C. For example, both the first electrode plate C11 and the third electrode plate C13 are electrically connected to a common signal line VCOM in the peripheral area NA through a connection line. In this way, a constant voltage signal (for example, a common voltage signal) is provided to the first electrode plate C11 and the third electrode plate C13 through the common signal line VCOM.

The second electrode plate C12 is used as a second terminal of the storage capacitor C. A gate G of the switching transistor T2 is electrically connected to a gate line GL, a first electrode TS of the switching transistor T2 is electrically connected to a data line DL, and a second electrode TD of the switching transistor T2 is electrically connected to the second terminal of the storage capacitor C. The switching transistor T2 is turned on in response to an active level signal provided by the gate line GL, while a data voltage signal on the data line DL may be written into the storage capacitor C through the switching transistor T2.

In the example shown in FIG. 1, the storage capacitor C includes two electrode plates. For example, a first electrode plate C1 is in the first conductive layer and a second electrode plate C2 is in the second conductive layer. In a thickness direction of the display substrate, the first electrode plate C1 and the second electrode plate C2 overlap, and are insulated and spaced apart from each other. Compared with the example shown in FIG. 1, the third electrode plate C13 is added to the storage capacitor C in the embodiments of the present disclosure, and the third electrode plate C13 overlaps with the first electrode plate C11 and the second electrode plate C12. In this way, the capacitance of the storage capacitor C may be increased to a large extent, while the storage capacitor C is changed only by a small size in the horizontal direction or a size of the storage capacitor in the horizontal direction is even unchanged, which is beneficial to the design of the sub-pixel with the small size.

The switching transistor T2 may include a top gate structure or a bottom gate structure. Exemplarily, in the embodiments of the present disclosure, the switching transistor T2 adopts a bottom gate structure. For example, the semiconductor layer 210 is between the first conductive layer 220 and the second conductive layer 230, and the gate G of the switching transistor T2 is in the first conductive layer 220. An orthographic projection of the gate G of the switching transistor T2 on the base substrate 200 covers an orthographic projection of the active portion A on the base substrate 200. The active portion A includes a first electrode connection portion, a second electrode connection portion, and a channel portion between the first electrode connection portion and the second electrode connection portion. The first electrode connection portion is electrically connected to the first electrode TS of the switching transistor T2, and the second electrode connection portion is electrically connected to the second electrode TD of the switching transistor T2.

In the reflective section FS, only the switching transistor T2 is provided with the active portion A. The active portion A causes a step difference of film layers in the reflective section FS, thereby affecting a film thickness uniformity in the reflective section FS. In view of this, in the embodiments of the present disclosure, the orthographic projection of the third electrode plate C13 on the base substrate 200 is spaced apart from the orthographic projection of the active portion A on the base substrate 200, and a thickness of the third electrode plate C13 is substantially the same as a thickness of the active portion A.

For example, a ratio of the thickness of the active portion A to the thickness of the third electrode plate C13 may be set to range from 8:11 to 11:8. For example, the ratio of the thickness of the active portion A to the thickness of the third electrode plate C13 may be set to range from 9:11 to 11:9. Preferably, the ratio of the thickness of the active portion A to the thickness of the third electrode plate C13 may be set to range from 10:11 to 11:10. Ideally, the ratio of the thickness of the active portion A to the thickness of the third electrode plate C13 may be set to 1:1. In this case, a film thickness difference may be better reduced.

The thickness of the active portion A may be set to range from 0.12 μm to 0.24 μm. For example, the thickness of the active portion A may be set to 0.14 μm, 0.16 μm, 0.18 μm, 0.2 μm, or 0.22 μm. The thickness of the third electrode plate C13 may be set to range from 0.14 μm to 0.26 μm. For example, the thickness of the third electrode plate C13 may be set to 0.16 μm, 0.18 μm, 0.2 μm, 0.22 μm or 0.24 μm. In the embodiments of the present disclosure, the thickness of the active portion A may be set to 0.18 μm, and the thickness of the third electrode plate C13 may be set to 0.2 μm.

It will be noted that the ratio of the thickness of the active portion A to the thickness of the third electrode plate C13 and specific numerical values of these thicknesses are not limited to the above examples, and specifically, they may be selected according to actual needs, as long as a difference between the thickness of the active portion A and the thickness of the third electrode plate C13 does not exceed 30%.

In this way, the step difference of the film layers caused by the active portion A may be reduced or evened eliminated using the third electrode plate C13, which is beneficial to the improvement of the film thickness uniformity o in the reflective section FS.

Therefore, the third electrode plate C13 may not only increase the capacitance of the storage capacitor C, but also reduce or eliminate the step difference of the film layers caused by the active portion A, so that the reflective surface in the reflective section FS is flat, thereby improving the reflection efficiency of the reflective section FS.

The embodiments of the present disclosure are further described below.

In some specific embodiments, the display substrate further includes a transparent conductive layer 240 and a first insulating layer 250. The transparent conductive layer 240 is on a side of the second conductive layer 230 away from the base substrate 200. The first insulating layer 250 is between the second conductive layer 230 and the transparent conductive layer 240.

In the embodiments of the present disclosure, a material of the transparent conductive layer 240 may include a transparent conductive material. For example, the material of the transparent conductive layer 240 may include indium tin oxide (ITO). The first insulation layer 250 may include an inorganic insulation material, an organic insulation material, or any combination thereof. For example, the inorganic insulating material may include silicon oxide, silicon nitride, silicon oxynitride, etc., and the organic insulating material may include polyimide, polyamide, acrylic resin, phenolic resin, benzocyclobutene, etc.

In the embodiments of the present disclosure, the third electrode plate C13 may be in the transparent conductive layer 240, or the third electrode plate C13 may also be in a first reflective conductive layer that will be mentioned below. The solution in which the third electrode plate C13 is in the transparent conductive layer 240 according to the embodiments of the present disclosure will be described below with reference to FIGS. 3 to 16.

The third electrode plate C13 is provided in the transparent conductive layer 240, the third electrode plate C13 may have various shapes. For example, the third electrode plate C13 may be provided in various shapes, such as a closed-shaped polygon including straight edges (for example, a rectangle), a circle or an ellipse including a curved edge, or a semicircle or semi ellipse including both a straight edge and a curved edge. In the embodiments of the present disclosure, the third electrode plate C13 may be provided as an area having a shape of a quadrilateral including straight edges. It will be understood that this is only an exemplary embodiment of the present disclosure, rather than a limitation to the present disclosure. For example, in some other embodiments, the third electrode plate C13 may also include a shape whose pattern is complementary to a pattern of the active portion A, which will be described in detail below, and therefore will not be described here.

The $n^{th}$ sub-pixel PX further includes a transparent conductive portion 241 in the transparent conductive layer 240, which is insulated and spaced apart from the third electrode plate C13. The transparent conductive portion 241 includes a first sub-portion 2411 and a second sub-portion 2412, and the first sub-portion 2411 and the second sub-portion 2412 are electrically connected. The first insulating layer 250 is provided with a first via hole V1 passing through the first insulating layer 250, the first sub-portion 2411 is located in the transmissive section TS, and the second sub-portion 2412 is located in the reflective section FS. An orthographic projection of the second sub-portion 2412 on the base substrate 200 and the orthographic projection of the second electrode plate C12 on the base substrate 200 have an overlapping area therebetween, in which the second sub-portion 2412 and the second electrode plate C12 are electrically connected through the first via hole V1.

In the embodiments of the present disclosure, the first sub-portion 2411 may be a pixel electrode provided in the transmissive section TS. For example, after the display substrate and the counter substrate 300 are aligned, the liquid crystal layer is provided on a side of the first sub-portion 2411 away from the base substrate 200. Since the transparent conductive layer 240 includes a transparent conductive material, the first sub-portion 2411 allows light to pass through, that is, the light emitted by the backlight module may pass through the first sub-portion 2411 and be incident into the liquid crystal layer. One terminal of the second electrode plate C12 is electrically connected to the second electrode TD of the switching transistor T2, and the other terminal of the second electrode plate C12 is electrically connected to the second sub-portion 2412 through the first via hole V1. In this way, when the switching transistor T2 is turned on, a data voltage signal on the data line DL may be transmitted to the first sub-portion 2411 through the switching transistor T2, the second electrode plate C12 and the second sub-portion 2412, so that a first electric field may be generated between the first sub-portion 2411 and the corresponding common electrode. The first electric field may drive the liquid crystal in the liquid crystal layer to change the rotation direction, so as to achieve the display function.

In some specific embodiments, the display substrate further includes a second reflective conductive layer 260, and the second reflective conductive layer 260 is on a side of the transparent conductive layer 240 away from the base substrate 200. The $n^{th}$ sub-pixel PX further includes a reflective portion 261 in the second reflective conductive layer 260, and the reflective portion 261 is provided with a fourth opening K4. An orthographic projection of the reflective portion 261 on the base substrate 200 at least covers the orthographic projection of the active portion A and the orthographic projection of the third electrode plate C13 on the base substrate 200, and an orthographic projection of the fourth opening K4 on the base substrate 200 covers an orthographic projection of the first sub-portion 2411 on the base substrate 200.

A material of the second reflective conductive layer 260 includes a conductive material capable of reflecting light, so that the reflective portion 261 may reflect light. In this way, the reflective portion 261 may be used to reflect environmental light during the reflective display, and may be used to prevent light leakage during the transmissive display. The fourth opening K4 exposes a part of the reflective section FS of the sub-pixel PX, so that the light emitted by the backlight module may be emitted from this part during the transmission display. The reflective portion 261 is electrically connected to the first sub-portion 2411 at an edge of the fourth opening K4, so that the reflective portion 261 may serve as a pixel electrode in the reflective section FS.

For example, after the display substrate and the counter substrate 300 are aligned, the liquid crystal layer is located on a side of the reflective portion 261 away from the base substrate 200. In this way, environmental light may be reflected back into the liquid crystal layer through the reflective portion 261 during the reflective display. In addition, when the switching transistor T2 is turned on, the data voltage signal on the data line DL may be transmitted to the reflective portion 261 through the switching transistor T2, the second electrode plate C12, the second sub-portion 2412 and the first sub-portion 2411, so that a second electric field may be generated between the reflective portion 261 and the corresponding common electrode. The second electric field may drive the liquid crystal in the liquid crystal layer to change the rotation direction, so as to achieve the display function.

Referring to FIG. 13, the reflective portion 261 covers above the active portion A and the third electrode plate C13. Through the third electrode plate C13, a part of the reflective portion 261 covering above the active portion A and a part of the reflective portion 261 covering above the third electrode plate C11 are substantially located in a same horizontal plane, so that the reflective surface in the reflective section FS may be as flat as possible.

In addition to covering above the active portion A and the third electrode plate C13, the orthographic projection of the reflective portion 261 on the base substrate 200 may further cover an orthographic projection of the entire reflective section FS on the base substrate 200. Further, the orthographic projection of the reflective portion 261 on the base substrate 200 may also overlap with adjacent gate lines and data lines. For example, the reflective portion 261 in the $n^{th}$ sub-pixel PX may overlap with an $x^{th}$ data line DL, an $(x+1)^{th}$ data line DL, a $(y-1)^{th}$ gate line GL, and a $y^{th}$ gate line GL. In this way, on the one hand, a reflective area during the reflective display may be increased, and on the other hand, the reflective portion 261, the data line GL and the gate line DL may replace the black matrix in the color filter substrate to shield light during the transmissive display. In this way, the black matrix in the color filter substrate may be omitted, which may increase the amount of incident light during the reflective display.

In some specific embodiments, the first electrode plate C11 includes a third sub-portion 211 and a fourth sub-portion 212. An orthographic projection of the fourth sub-portion 212 on the base substrate 200 is on a side of the orthographic projection of the second sub-portion 2412 on the base substrate 200 away from the orthographic projection of the first sub-portion 2411 on the base substrate 200, an orthographic projection of the third sub-portion 211 on the base substrate 200 is on a side of the orthographic projection of the fourth sub-portion 212 on the base substrate 200 proximate to the second sub-portion 2412, and the orthographic projection of the third sub-portion 211 on the base substrate 200 at least partially surrounds the orthographic projection of the first via hole V1 on the base substrate 200. A part of the orthographic projection of the third sub-portion 211 on the base substrate 200 overlaps with the orthographic projection of the second sub-portion 2412 on the base substrate 200, and another part the orthographic projection of the third sub-portion 211 on the base substrate 200 is spaced apart from the orthographic projection of the second sub-portion 2412 on the base substrate 200. The third sub-portion 211 overlaps with the second sub-portion 2412 in the thickness direction of the display substrate, and also extends from the overlapping area to a periphery of the second sub-portion 2412.

The first via hole V1 is closer to the first sub-portion 2411 than the fourth sub-portion 212. The orthographic projection of the third sub-portion 211 on the base substrate 200 has substantially a "U" shape. In the thickness direction of the display substrate, an inner side of the U-shape overlaps with the second sub-portion 2412, and an outer side of the U-shape is spaced apart from the second sub-portion 2412, so that the third sub-portion 211 surrounds a periphery of the first via hole V1 and there is a certain distance between the third sub-portion 211 and the first via hole V1. In this way, it is possible to prevent electrostatic discharge from occurring near the position of the first via hole V1 and causing breakdown of a nearby element. For example, when the first via hole V1 is formed through a dry etching process (such as plasma bombardment), charge will be accumulated on the second electrode plate C12 exposed by the first via hole V1. In the embodiments of the present disclosure, the third sub-portion 211 surrounds the periphery of the first via hole V1 and keeps a certain distance away from the first via hole V1, so that an electrostatic discharge path between the charge accumulation position on the second electrode plate C12 and the third sub-portion 211 may be prevented, thereby preventing the occurrence of electrostatic discharge.

In addition, the third sub-portion 211 extends to the periphery of the second sub-portion 2412, specifically, extends to a periphery of the overlapping area between the second electrode plate C12 and the second sub-portion 2412. The third sub-portion 211 may reduce a step difference of film layers caused by the overlap between the second sub-portion 2412 and the second electrode plate C12, which is beneficial to the film thickness uniformity in the overlapping area between the second electrode plate C12 and the second sub-portion 2412 and its periphery, thereby improving the flatness of the reflective surface in the reflective section FS.

Optionally, the orthographic projection of the third sub-portion 211 on the base substrate 200 may overlap with the orthographic projection of the second electrode plate C12 on the base substrate 200. In this way, the capacitance of the storage capacitor C may be further increased.

In some specific embodiments, the third sub-portion 211 includes: a first structure 2111 and a second structure 2112.

In the embodiments of the present disclosure, the first structure 2111 and the second structure 2112 may include strip-like structures, and sizes of the first structure 2111 and the second structure 2112 in the first direction Y are greater than their respective sizes in the second direction X. For example, referring to FIG. 3, the first structure 2111 and second structure 2112 are vertically extending strip-like structures.

The orthographic projection of the first sub-portion 2411 on the base substrate 200, the orthographic projection of the second sub-portion 2412 on the base substrate 200 and the orthographic projection of the active portion A on the base substrate 200 are arranged in the first direction Y. The orthographic projection of the first via hole V1 on the base substrate 200 is located on a side of the orthographic projection of the first sub-portion 2411 on the base substrate 200 proximate to the orthographic projection of the active portion A on the base substrate 200. In the second direction X, orthographic projections of the first structure 2111 and the second structure 2112 on the base substrate 200 are respectively on opposite sides of the orthographic projection of the first via hole V1 on the base substrate 200.

An orthographic projection of a part of the first structure 2111 proximate to the second structure 2112 on the base substrate 200 overlaps with the orthographic projection of the second electrode plate C12 on the base substrate 200, and an orthographic projection of a part of the first structure 2111 away from second structure 2112 on the base substrate 200 is spaced apart from the orthographic projection of the second electrode plate C12 on the base substrate 200. And/or, an orthographic projection of a part of the second structure 2112 proximate to the first structure 2111 on the base substrate 200 overlaps with an orthographic projection of the second electrode plate C12 on the base substrate 200, and an orthographic projection of a part of the second structure 2112 away from the first structure 2111 on the base substrate 200 is spaced apart from the orthographic projection of the second electrode plate C12 on the base substrate 200. The second direction X and the first direction Y intersect with each other.

In the embodiments of the present disclosure, the plurality of gate lines GL are arranged in the first direction Y, and the $n^{th}$ sub-pixel PX is electrically connected to the $y^{th}$ gate line GL. The first sub-portion 2411, the second sub-portion 2412 and the active portion A are arranged in sequence in a direction from the $(y-1)^{th}$ gate line GL to the $y^{th}$ gate line GL. The plurality of data lines DL are arranged in the second direction X, and the $n^{th}$ sub-pixel PX is electrically connected to the $x^{th}$ data line DL. The first structure 2111, the first via hole V1 and the second structure 2112 are arranged in sequence in the direction from the $x^{th}$ data line DL to the $(x+1)^{th}$ data line DL.

In the embodiments of the present disclosure, any one of the orthographic projection of the first structure 2111 on the base substrate 200 and the orthographic projection of the second structure 2112 on the base substrate 200 partially overlaps with the orthographic projection of the second sub-portion 2412 on the base substrate 200. For example, in the thickness direction of the display substrate, a right side of the first structure 2111 overlaps with the second sub-portion 2412, and a left side of the first structure 2111 is spaced apart from the second sub-portion 2412. A left side of the second structure 2112 overlaps with the second sub-portion 2412, and A right side of the second structure 2112 is spaced apart from the second sub-portion 2412. In this way, the third sub-portion 211 may reduce a step difference between the film layers in the overlapping area of the second electrode plate C12 and the second sub-portion 2412, and the film layers on the left and right sides of the third sub-portion 211.

Figure 14:
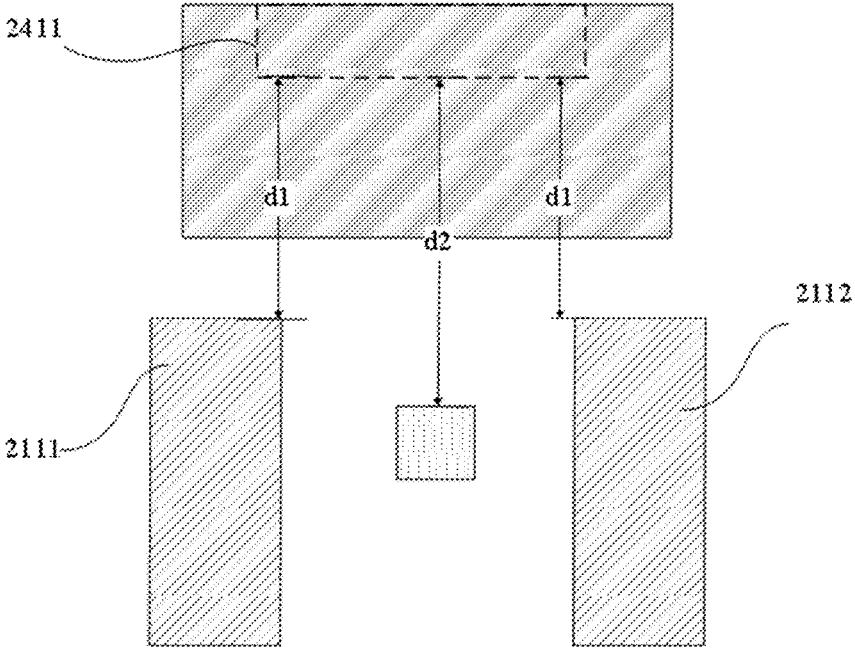
FIG. 14 schematically shows a spacing between a first structure and a first sub-portion, a spacing between a second structure and the first sub-portion, and a spacing between a first via hole and the first sub-portion according to an embodiment of the present disclosure.

FIG. 14 schematically shows a spacing between a first structure and a first sub-portion, a spacing between a second structure and the first sub-portion, and a spacing between a first via hole and the first sub-portion according to an embodiment of the present disclosure.

Referring to FIG. 14, in some specific embodiments, in the first direction Y, any one of the orthographic projection of the first structure 2111 on the base substrate 200 and the orthographic projection of the second structure 2112 on the base substrate 200 has a first spacing d1 from the orthographic projection of the first sub-portion 2411 on the base substrate 200, and the orthographic projection of the first via hole V1 on the base substrate 200 has a second spacing d2 from the orthographic projection of the first sub-portion 2411 on the base substrate 200.

In the embodiments of the present disclosure, the first spacing d1 may refer to an average spacing between the orthographic projection of the first structure 2111 (the second structure 2112) on the base substrate 200 and the orthographic projection of the first sub-portion 2411 on the base substrate 200, and the second spacing d2 may refer to an average distance between the orthographic projection of the first via hole V1 on the base substrate 200 and the orthographic projection of the first sub-portion 2411 on the base substrate 200. The first spacing d1 is smaller than the second spacing d2, so that the first structure 2111 (the second structure 2112) extends to the maximum extent towards the first sub-portion 2411, so as to increase an coverage area of the first structure 2111 (the second structure 2112), so that the film thickness uniformity may be further improved.

Referring to FIG. 6 and FIG. 11, in some specific embodiments, the transparent conductive portion 241 further includes a connecting sub-portion 2413 between the first sub-portion 2411 and the second sub-portion 2412. The orthographic projection of the second electrode plate C12 on the base substrate 200 overlaps with an orthographic projection of the connecting sub-portion 2413 on the base substrate 200.

Optionally, the connecting sub-portion 2413 may be arranged around the first sub-portion 2411, and any one of the orthographic projection of the first structure 2111 on the base substrate 200 and the orthographic projection of the second structure 2112 on the base substrate 200 is spaced apart from the orthographic projection of the connecting sub-portion 2413 on the base substrate 200. The second electrode plate C12 is closer to the first sub-portion 2411 than the first structure 2111 (second structure 2112). The second electrode plate C12 is in close proximity to the transmissive section TS, thereby facilitating the alignment based on the second electrode plate C12 in subsequent steps.

Referring to FIG. 9 and FIG. 11, in some specific embodiments, the orthographic projection of the third electrode plate C13 on the base substrate 200 overlaps with the orthographic projection of the fourth sub-portion 212 on the base substrate 200. In this way, the first electrode plate C11, the second electrode plate C12 and the third electrode plate C13 may overlap with one another, so that a space occupied by the three electrode plates in the horizontal direction may be reduced.

Optionally, in the first direction Y, the orthographic projection of the third electrode plate C13 on the base substrate 200 is between the orthographic projection of the second sub-portion 2412 on the base substrate 200 and the orthographic projection of the active portion A on the base substrate 200. In this way, the third electrode plate C13 is further away from the second sub-portion 2412 than the third sub-portion 211, so that there may be a certain distance between the third electrode plate C13 and the second sub-portion 2412, so as to prevent a short circuit between the third electrode plate C13 and the second sub-portion 2412.

Figures 15, 16:
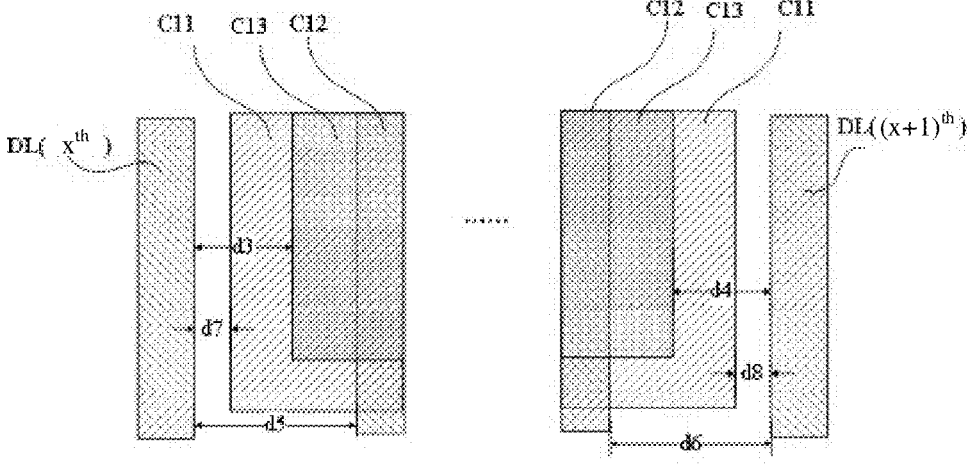
FIG. 15 schematically shows a spacing between a first electrode plate and a data line, a spacing between a second electrode plate and the data line, and a spacing between a third electrode plate and the data line according to an embodiment of the present disclosure.
FIG. 16 schematically shows a spacing between a first electrode plate and an active portion, a spacing between a second electrode plate and the active portion, and a spacing between a third electrode plate and the active portion according to an embodiment of the present disclosure.

FIG. 15 schematically shows a spacing between a first electrode plate and a data line, a spacing between a second electrode plate and the data line, and a spacing between a third electrode plate and the data line according to an embodiment of the present disclosure.

Referring to FIG. 11 and FIG. 15, in some specific embodiments, the display substrate further includes the plurality of data lines DL arranged in the second direction X, and the $x^{th}$ data line DL is electrically connected to the $n^{th}$ sub-pixel PX. In the $n^{th}$ sub-pixel PX, in the second direction X, the orthographic projection of the third electrode plate C13 on the base substrate 200 has a third spacing d3 from an orthographic projection of the $x^{th}$ data line DL on the base substrate 200, the orthographic projection of the third electrode plate C13 on the base substrate 200 has a fourth spacing d4 from an orthographic projection of the $(x+1)^{th}$ data line DL on the base substrate 200, the orthographic projection of the second electrode plate C12 on the base substrate 200 has a fifth spacing d5 from the orthographic projection of the $x^{th}$ data line DL on the base substrate 200, and the orthographic projection of the second electrode plate C12 on the base substrate 200 has a sixth spacing d6 from the orthographic projection of the $(x+1)^{th}$ data line DL on the base substrate 200.

It will be noted that the spacing mentioned above may refer to an average spacing or the minimum spacing between two structures. In the embodiments of the present disclosure, unless otherwise specified, descriptions are made by taking that the spacing refers to an average spacing between two structures as an example.

In the embodiment of the present disclosure, the third spacing d3 is smaller than the fifth spacing d5, and the fourth spacing d4 is smaller than the sixth spacing d6. In this way, there may be a safe distance between the second electrode plate C12 and each of the $x^{th}$ data line DL and the $(x+1)^{th}$ data line DL, so as to avoid a short circuit between the second electrode plate C12 and each of the $x^{th}$ data line DL and the $(x+1)^{th}$ data line DL. In the second direction X, the left side edge of the third electrode plate C13 is closer to the $x^{th}$ data line DL than the left side edge of the second electrode plate C12, and the right side edge of the third electrode plate C13 is closer to the $(x+1)^{th}$ data line DL than the right side edge of the second electrode plate C12, so as to prevent a change in the overlapping area between the second electrode plate C12 and the third electrode plate C13 due to process fluctuations (parts which are required to overlap with each other do not overlap with each other due to misalignment). In this way, it is conducive to ensuring the uniformity of the storage capacitance C.

In some specific embodiments, in the $n^{th}$ sub-pixel PX, in the second direction X, the orthographic projection of the first electrode plate C11 on the base substrate 200 has a seventh spacing d7 from the orthographic projection of the $x^{th}$ data line DL on the base substrate 200, and the orthographic projection of the first electrode plate C11 on the base substrate 200 has an eighth spacing d8 from the orthographic projection of the $(x+1)^{th}$ data line DL on the base substrate 200.

In the embodiment of the present disclosure, the fifth spacing d5 is greater than the seventh spacing d7, and the sixth spacing d6 is greater than the eighth spacing d8. In the second direction X, the left side edge of the first electrode plate C11 is closer to the $x^{th}$ data line DL than the left side edge of the second electrode plate C12, and the right side edge of the first electrode plate C11 is closer to the $(x+1)^{th}$ data line DL than the right side edge of the second electrode plate C12, so as to prevent a change in the overlapping area between the first electrode plate C11 and the third electrode plate C13 from changing due to process fluctuations (parts which are required to overlap with each other do not overlap with each other due to misalignment). In this way, it is conducive to ensuring the uniformity of the storage capacitance C.

Optionally, in the embodiments of the present disclosure, there is no limitation on a relationship between magnitudes of the third spacing d3 and the seventh spacing d7, and a relationship between magnitudes of fourth spacing d4 and the eighth spacing d8. For example, the third spacing d3 may be smaller than or equal to the seventh spacing d7, and the fourth spacing d4 may be smaller than or equal to the eighth spacing d8, as long as the spacing may ensure that the parasitic capacitance generated between the first electrode plate C11 (the third electrode plate C13) and the data line DL is within an acceptable range.

FIG. 16 schematically shows a spacing between a first electrode plate and an active portion, a spacing between a second electrode plate and the active portion, and a spacing between a third electrode plate and the active portion according to an embodiment of the present disclosure.

Referring to FIG. 11 and FIG. 16, in some specific embodiments, the orthographic projection of the third electrode plate C13 on the base substrate 200 and the orthographic projection of the active portion A on the base substrate 200 are arranged in the first direction Y. In the first direction Y, the orthographic projection of the third electrode plate C13 on the base substrate 200 has a ninth spacing d9 from the orthographic projection of the active portion A on the base substrate 200. The orthographic projection of the second electrode plate C12 on the base substrate 200 and the orthographic projection of the active portion A on the base substrate 200 are arranged in the first direction Y. In the first direction Y, the orthographic projection of the second electrode plate C12 on the base substrate 200 has a tenth spacing d10 from the orthographic projection of the active portion A on the base substrate 200. The first direction Y and the second direction X intersect with each other.

In the embodiments of the present disclosure, the ninth spacing d9 is greater than the tenth spacing d10. In the first direction Y, a lower side of the second electrode plate C12 is closer to the active portion A than a lower side of the third electrode plate C13. In this way, an area of the third electrode plate C13 may be prevented from being too large, so that there may be a safe distance between the third electrode plate C13 and the active portion A, thereby preventing the common voltage signal on the third electrode plate C13 from interfering with the characteristics of the switching transistor T2.

In some specific embodiments, the orthographic projection of the first electrode plate C11 on the base substrate 200 and the orthographic projection of the active portion A on the base substrate 200 are arranged in the first direction Y. In the first direction Y, the orthographic projection of the first electrode plate C11 on the base substrate 200 has an eleventh spacing d11 from the orthographic projection of the active portion A on the base substrate 200.

In the embodiments of the present disclosure, the ninth spacing d9 is smaller than the eleventh spacing d11. In the first direction Y, the lower side of the second electrode plate C12 is closer to the active portion A than a lower side of the first electrode plate. In this way, an area of the first electrode plate C11 may be prevented from being too large, which is beneficial to maintaining a sufficient spacing between the first electrode plate C11 and the active portion A, so that the first electrode plate C11 may be prevented from interfering with the characteristics of the switching transistor T2.

Optionally, the orthographic projection of the gate G of the switching transistor T2 on the base substrate 200 covers the orthographic projection of the active portion A on the base substrate 200, and the orthographic projection of the first electrode plate C11 on the base substrate 200 and the orthographic projection of the gate G of the switching transistor T2 on the base substrate 200 are arranged in the first direction Y. In the first direction Y, the orthographic projection of the first electrode plate C11 on the base substrate 200 has a twelfth spacing from the orthographic projection of the gate G of the switching transistor T2 on the base substrate 200. The orthographic projection of the second electrode plate C12 on the base substrate 200 and the orthographic projection of the gate G of the switching transistor T2 on the base substrate 200 are arranged in the first direction Y. In the first direction Y, the orthographic projection of the second electrode plate C12 on the base substrate 200 has a thirteenth spacing from the orthographic projection of the gate G of the switching transistor T2 on the base substrate 200. The thirteenth spacing is smaller than the twelfth spacing. In this way, there may be a sufficient distance between the first electrode plate C11 and the gate G of the switching transistor T2, so as to prevent a short circuit between the first electrode plate C11 and the gate G of the switching transistor T2.

Referring to FIG. 13, in some embodiments, in addition to the first insulating layer 250 mentioned above, a respective insulating layer may be arranged between two adjacent film layers with conductive properties. For example, a second insulating layer 280 is arranged between the first conductive layer 220 and the semiconductor layer 210. The second insulating layer 280 may also be called a gate insulating layer. A planarization layer 290 may be arranged between the transparent conductive layer 240 and the second reflective conductive layer 260, and the planarization layer 290 may include an organic material. The planarization layer 290 is used to reduce the step difference of the film layers, so as to keep the second reflective conductive layer 260 as flat as possible.

A manufacturing process in the embodiments of the present disclosure are briefly described below.

First, the first conductive layer 220 is formed on the base substrate 200. The first conductive layer 220 includes the first electrode plate C11, the gate of the switching transistor T2, and the gate line GL. After that, the second insulating layer 280 is formed on the first conductive layer 220, and the semiconductor layer 210 is formed on the second insulating layer 280, where the semiconductor layer 210 includes the active portion A. Further, the second conductive layer 230 is formed on the semiconductor layer 210, where the second conductive layer 230 includes the second electrode plate C12, the source and the drain of the switching transistor T2 and the data line DL. Next, the first insulating layer 250 is formed on the second conductive layer 230, and the first via hole V1 is formed. Then, the transparent conductive layer 240 is formed on the first insulating layer 250, where the transparent conductive layer 240 includes the third electrode plate C13 and the transparent conductive portion 241, and the transparent conductive portion 241 is electrically connected to the second electrode plate C12 through the first via hole V1. Finally, the planarization layer 290 and the second reflective conductive layer 260 are formed on the transparent conductive layer 240, and a large hole V2 is formed in the planarization layer 290 at a position corresponding to the transmissive section TS, where the second reflective conductive layer 260 is in contact with and connected to the transparent conductive portion 241 at the position of the large hole V2.

Through the above embodiments, adding the third electrode plate C13 in the transparent conductive layer 240 may increase the capacitance of the storage capacitor C without complicating the manufacturing process, while reducing the step difference of the film layers caused by the active portion A.

Figure 17:
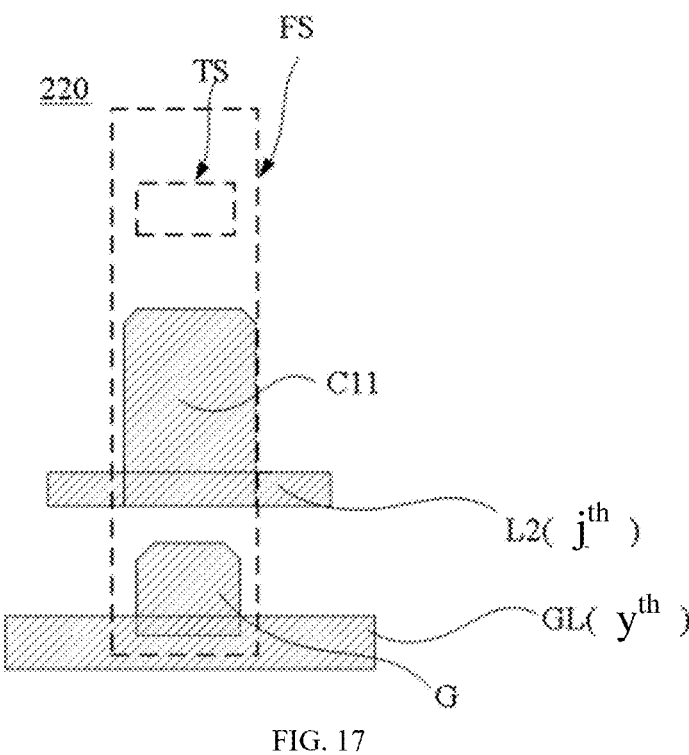
FIG. 17 schematically shows a top view of a first conductive layer according to some other embodiments of the present disclosure.
Figure 18:
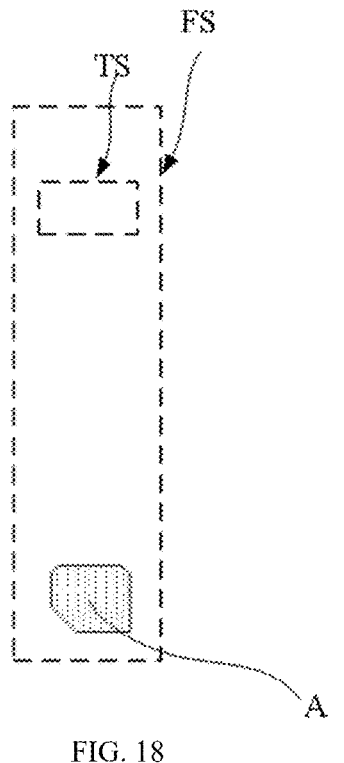
FIG. 18 schematically shows a top view of a semiconductor layer according to some other embodiments of the present disclosure.
Figure 19:
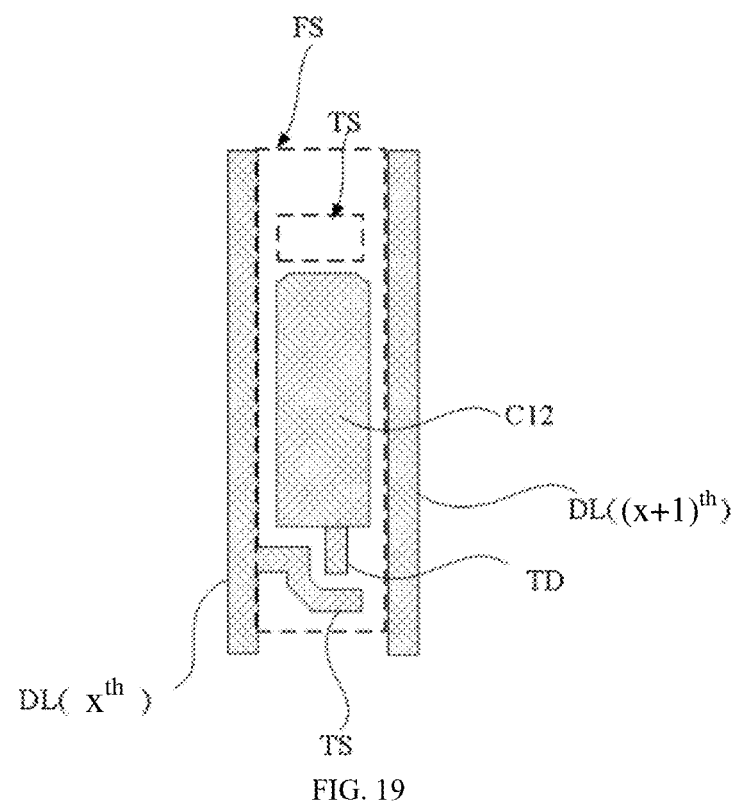
FIG. 19 schematically shows a top view of a second conductive layer according to some other embodiments of the present disclosure.
Figure 20:
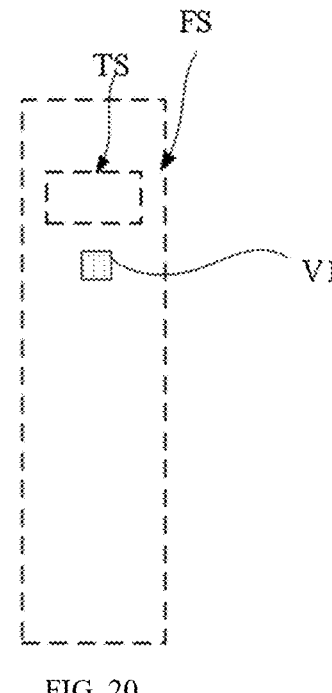
FIG. 20 schematically shows a top view of a first insulating layer according to some other embodiments of the present disclosure.
Figure 21:
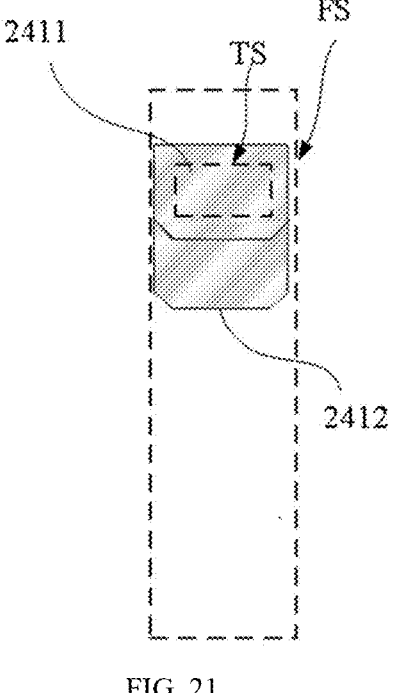
FIG. 21 schematically shows a top view of a transparent conductive layer according to some other embodiments of the present disclosure.
Figure 22:
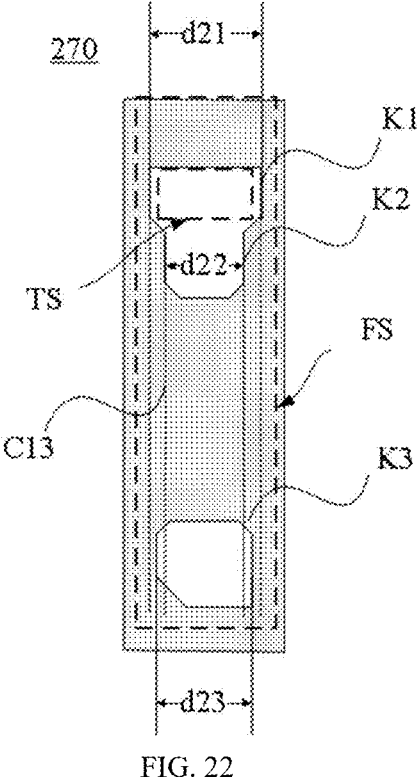
FIG. 22 schematically shows a top view of a first reflective conductive layer according to some other embodiments of the present disclosure.
Figure 23:
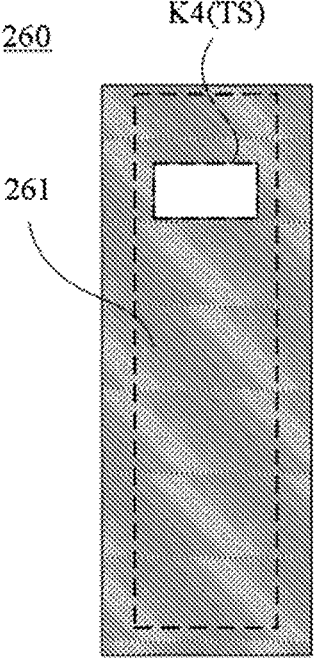
FIG. 23 schematically shows a top view of a second reflective conductive layer according to some other embodiments of the present disclosure.
Figure 24:
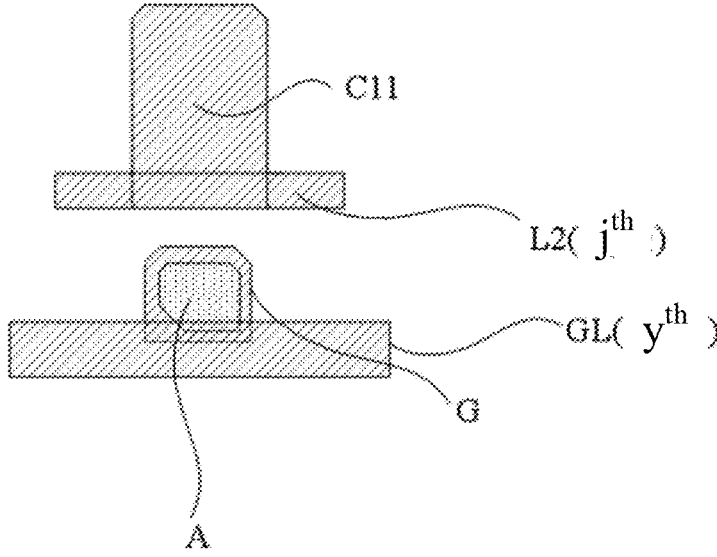
FIG. 24 schematically shows a top view of a first conductive layer and a semiconductor layer according to some other embodiments of the present disclosure.
Figure 25:
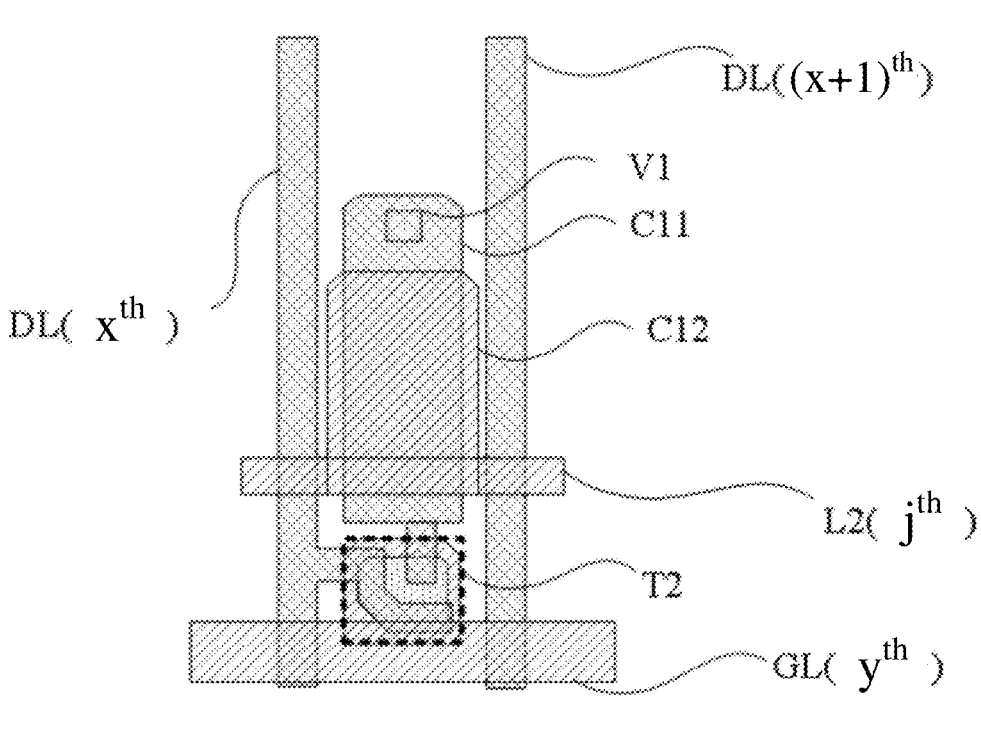
FIG. 25 schematically shows a top view of a first conductive layer, a semiconductor layer, a second conductive layer and a first insulating layer according to some other embodiments of the present disclosure.
Figure 26:
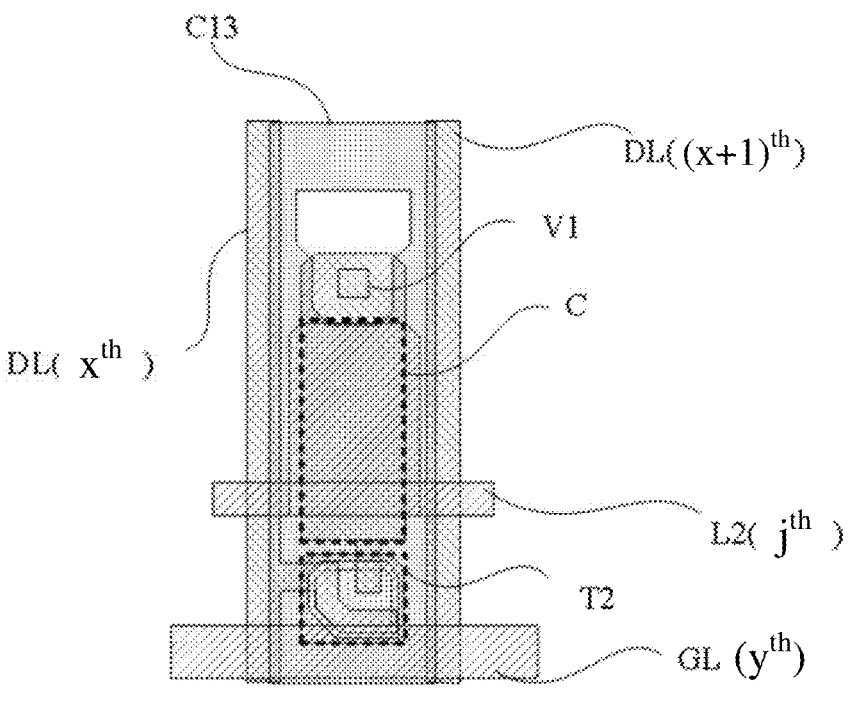
FIG. 26 schematically shows a top view of a first conductive layer, a semiconductor layer, a second conductive layer, a first insulating layer and a first reflective conductive layer according to some other embodiments of the present disclosure.
Figure 27:
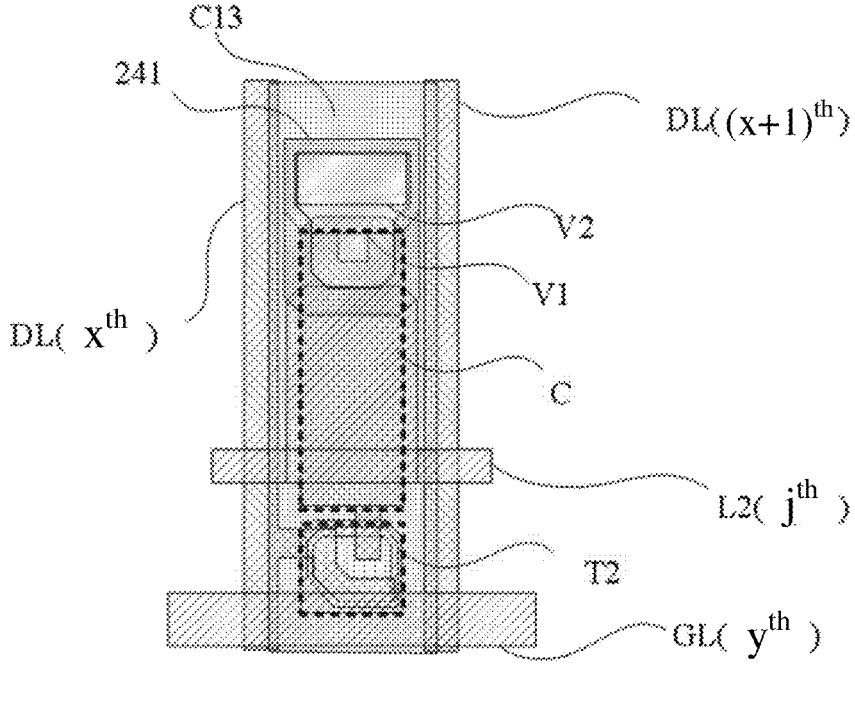
FIG. 27 schematically shows a top view of a first conductive layer, a semiconductor layer, a second conductive layer, a first insulating layer, a first reflective conductive layer and a transparent conductive layer according to some other embodiments of the present disclosure.
Figure 28:
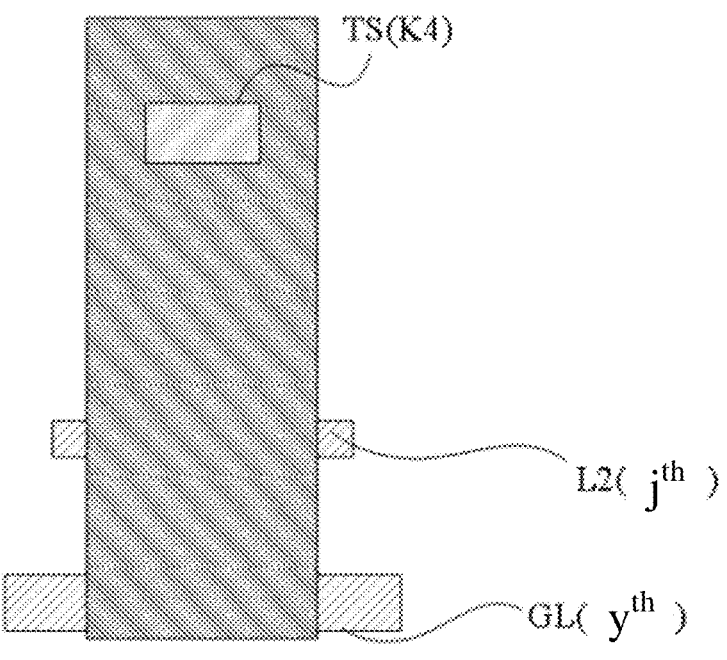
FIG. 28 schematically shows a top view of a first conductive layer, a semiconductor layer, a second conductive layer, a first insulating layer, a first reflective conductive layer, a transparent conductive layer and a second reflective conductive layer according to some other embodiments of the present disclosure.
Figure 29:
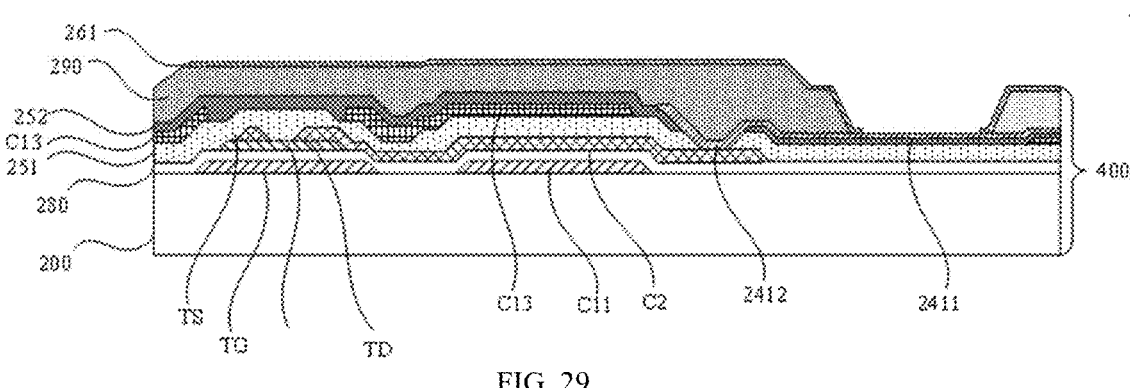
FIG. 29 schematically shows a cross-sectional view of a sub-pixel according to some other embodiments of the present disclosure.

FIGS. 17 to 28 schematically show top views of a sub-pixel according to some other embodiments of the present disclosure, and FIG. 29 schematically shows a cross-sectional view of a sub-pixel according to some other embodiments of the present disclosure. FIG. 17 schematically shows a top view of a first conductive layer according to some other embodiments of the present disclosure, FIG. 18 schematically shows a top view of a semiconductor layer according to some other embodiments of the present disclosure, FIG. 19 schematically shows a top view of a second conductive layer according to some other embodiments of the present disclosure, FIG. 20 schematically shows a top view of a first insulating layer according to some other embodiments of the present disclosure, FIG. 21 schematically shows a top view of a transparent conductive layer according to some other embodiments of the present disclosure, FIG. 22 schematically shows a top view of a first reflective conductive layer according to some other embodiments of the present disclosure, FIG. 23 schematically shows a top view of a second reflective conductive layer according to some other embodiments of the present disclosure, FIG. 24 schematically shows a top view of a first conductive layer and a semiconductor layer according to some other embodiments of the present disclosure, FIG. 25 schematically shows a top view of a first conductive layer, a semiconductor layer, a second conductive layer and a first insulating layer according to some other embodiments of the present disclosure, FIG. 26 schematically shows a top view of a first conductive layer, a semiconductor layer, a second conductive layer, a first insulating layer and a first reflective conductive layer according to some other embodiments of the present disclosure, FIG. 27 schematically shows a top view of a first conductive layer, a semiconductor layer, a second conductive layer, a first insulating layer, a first reflective conductive layer and a transparent conductive layer according to some other embodiments of the present disclosure, and FIG. 28 schematically shows a top view of a first conductive layer, a semiconductor layer, a second conductive layer, a first insulating layer, a first reflective conductive layer, a transparent conductive layer and a second reflective conductive layer according to some other embodiments of the present disclosure.

The solution in which the third electrode plate C13 is provided in the first reflective conductive layer in the embodiments of the present disclosure will be described below with reference to FIGS. 17 to 29.

In some specific embodiments, the display substrate further includes the first reflective conductive layer 270, which is on a side of the second conductive layer 230 away from the base substrate 200, and the third electrode plate C13 is in the first reflective conductive layer 270. The display substrate further includes the plurality of data lines DL and the plurality of gate lines GL. The plurality of data lines DL are arranged in the second direction X, and the plurality of gate lines GL are arranged in the first direction Y. The first direction Y and the second direction X intersect with each other. The $x^{th}$ data line DL is electrically connected to the $n^{th}$ sub-pixel PX, and the $y^{th}$ gate line GL is electrically connected to the $n^{th}$ sub-pixel PX. An orthographic projection of at least one of the $x^{th}$ data line DL, the $(x+1)^{th}$ data line DL, the $(y-1)^{th}$ gate line GL and the $y^{th}$ gate line GL on the base substrate 200 overlaps with the orthographic projection of the third electrode plate C13 of the $n^{th}$ sub-pixel PX on the base substrate 200. Each of x and y is a positive integer.

In the embodiments of the present disclosure, the first reflective conductive layer 270 includes a metal material capable of reflecting light, such as silver, copper, aluminum, etc., or an alloy material of the above metals. Since the first reflective conductive layer 270 includes the metal material capable of reflecting light, the third electrode plate C13 provided in the first reflective conductive layer 270 may reflect light. Based on this, in the embodiments of the present disclosure, the third electrode plate C13 may overlap with at least one of the $x^{th}$ data line DL, the $(x+1)^{th}$ data line DL, the $(y-1)^{th}$ gate line GL, and the $y^{th}$ gate line GL, so as to replace the black matrix which is originally provided in the color filter substrate to achieve the light-shielding function, thereby preventing light leakage during the transmission display. In addition, the use of the third electrode plate C13, the data line DL and the gate line GL instead of the black matrix may increase the amount of incident light during the reflective display, while increasing the reflective area, so that the display effect during the reflective display may be improved. For example, in the thickness direction of the display substrate, the third electrode plate C13 overlaps with each of the $x^{th}$ data line DL, the $(x+1)^{th}$ data line DL, the $(y-1)^{th}$ gate line GL and the $y^{th}$ gate line GL, thereby covering the reflective section FS as much as possible.

Moreover, the third electrode plate C13 may reflect light, and compared with the foregoing embodiment, in the embodiments of the present disclosure, the line width of the gate line GL and the line width of the data line DL may be reduced, so that the space occupied by the gate line GL and the data line DL may be reduced, and this is beneficial to the increase of a size of each structure in the sub-pixel PX. For example, in the embodiments of the present disclosure, the line width of the gate line GL may be set to range from 3 μm to 6 μm, and the line width of the data line DL may be set to range from 2 μm to 4 μm. After the line width of the gate line GL and the line width of the data line DL are reduced, the size of the third electrode plate C13 in the first direction Y and the size of the third electrode plate C13 the second direction X may be increased, so as to ensure that the third electrode plate C13 of the $n^{th}$ sub-pixel PX may overlap with each of the $x^{th}$ data line DL, the $(x+1)^{th}$ data line DL, the $(y-1)^{th}$ gate line GL and the $y^{th}$ gate line GL in the thickness direction of the display substrate. In this way, it may be ensured that light leakage does not occur during the transmission display.

Optionally, the third electrode plates C13 in the sub-pixels PX adjacent to each other may be formed as an integral structure.

In some specific embodiments, the display substrate further includes the transparent conductive layer 240 and the first insulating layer 250. The transparent conductive layer 240 is on a side of the second conductive layer 230 away from the base substrate 200, and the first insulating layer 250 is between the second conductive layer 230 and the transparent conductive layer 240. The $n^{th}$ sub-pixel PX further includes a transparent conductive portion 241 in the transparent conductive layer 240. The transparent conductive portion 241 includes a first sub-portion 2411 and a second sub-portion 2412, and the first sub-portion 2411 and the second sub-portion 2412 are electrically connected. The first insulating layer 250 is provided with a first via hole V1 passing through the first insulating layer 250. The first sub-portion 2411 is in the transmissive section TS, and the second sub-portion 2412 is in the reflective section FS. An orthographic projection of the second sub-portion 2412 on the base substrate 200 and the orthographic projection of the second electrode plate C12 on the base substrate 200 have an overlapping area therebetween, in which the second sub-portion 2412 and the second electrode plate C12 are electrically connected through the first via hole V1.

Different from the foregoing embodiments, in this embodiment, the third electrode plate C13 is no longer arranged in the transparent conductive layer 240. However, a transparent conductive portion 241 is still arranged in the transparent conductive layer 240, and the transparent conductive portion 241 is used as a pixel electrode in the transmissive section TS. The transparent conductive portion 241 may adopt the same shape design as that in the foregoing embodiments, or may adopt a different shape design.

For example, in this embodiment, since the line width of the data line DL is reduced, the shape design of the transmissive section TS is more flexible. For example, the transmissive section TS may be in a shape of a strip extending vertically, as described in the foregoing embodiments. Alternatively, the transmissive section TS may be changed as having a shape of a strip extending horizontally without changing the area of the transmissive section TS. Alternatively, the transmissive section TS may be changed as having a square shape without changing the area of the transmissive section TS. Correspondingly, in this embodiment, the first sub-portion 2411 may be in the shape of a vertical strip, a horizontal strip, a square, etc.

In some specific embodiments, the second sub-portion 2412 may adopt the same shape design as that in the foregoing embodiments, or may adopt a different shape design.

For example, the first sub-portion 2411 adopts the same shape design as that in the foregoing embodiments, while the first electrode plate C11 adopts the design in the foregoing embodiments, that is, the first electrode plate C11 includes the above-mentioned third sub-portion 211, and the third sub-portion 211 extends to the periphery of the overlapping area between the second electrode plate C12 and the transparent conductive portion 241, so as to reduce the step difference between the film layers in the overlapping area and the film layers in its periphery.

Alternatively, the first sub-portion 2411 and the second sub-portion 2412 have substantially the same size in the second direction X. In addition, the design of the third sub-portion 211 in the first electrode plate C11 may be omitted, and the second sub-portion 2412 extends to the periphery of the overlapping area between the second electrode plate C12 and the transparent conductive portion 241, so as to reduce the step difference between the film layers in the overlapping area and the film layers in its periphery. Optionally, the third electrode plate C13 may cover the part of the second sub-portion 2412 extending to the periphery of the overlapping area, so that a parasitic capacitance between the second sub-portion 2412 and the data line DL may be prevented.

The third electrode plate C13 is provided with a first opening K1 and a second opening K2. An orthographic projection of the first opening K1 on the base substrate 200 covers the orthographic projection of the transmissive section TS on the base substrate 200, and an orthographic projection of the second opening K2 on the base substrate 200 covers the orthographic projection of the first via hole V1 on the base substrate 200. In this way, the third electrode plate C13 may avoid the transmissive section TS of the sub-pixel PX through the first opening K1. The second opening K2 exposes the first via hole V1, so that the subsequently formed transparent conductive portion 241 may be electrically connected to the second electrode plate C12 through the second opening K2 and the first via hole V1.

Optionally, the first opening K1 and the second opening K2 are formed as an integral structure. In addition to exposing the first via hole V1, the second opening K2 may also expose the second electrode plate C12 around the first via hole V1, so that there is a certain safe distance between the third electrode plate C13 and the first via hole V1. In this way, accidental damage to the third electrode plate C13 during an etching of the first via hole V1 may be avoided.

Optionally, the first opening K1 and the second opening K2 may adopt a non-right-angle corner, such as an arc-shaped corner area, etc., so as to reduce stress concentration at the corner.

Optionally, the orthographic projection of the second electrode plate C12 on the base substrate 200 covers the orthographic projection of the second opening K2 on the base substrate 200. For example, a left side edge of the second opening K2 is located on the right of a left side edge of the second electrode plate C12, and a right side edge of the second opening K2 is located on the left of a right side edge of the second electrode plate C12.

In some specific embodiments, the third electrode plate C13 is further provided with a third opening K3, and an orthographic projection of the third opening K3 on the base substrate 200 covers the orthographic projection of the active portion A on the base substrate 200. In the second direction X, the first opening K1 has a first size d21, the second opening K2 has a second size d22, and the third opening K3 has a third size d23. The third size d23 is smaller than the first size d21 and is larger than the second size d22.

In embodiments of the present disclosure, a pattern of the third opening K3 may be substantially the same as a pattern of the active portion A.

Optionally, the orthographic projection of the gate of the switching transistor T2 on the base substrate 200 covers the orthographic projection of the third opening K3 on the base substrate 200. In this way, the third electrode plate C13 may avoid the active portion A through the third opening K3, so that the third electrode plate C13 may be prevented from affecting the characteristics of the switching transistor T2, while an area of the third opening K3 is not too large, so that the third electrode plate C13 may cover as much of the reflective section FS as possible, thereby reducing the step difference of the film layers caused by the active portion A as much as possible.

In some specific embodiments, the orthographic projection of the first electrode plate C11 on the base substrate 200 overlaps with the orthographic projection of the second sub-portion 2412 on the base substrate 200, and the orthographic projection of the first electrode plate C11 on the base substrate 200 is on a side of the orthographic projection of the first via hole V1 on the base substrate 200 away from the first sub-portion 2411.

In the embodiments of the present disclosure, the first electrode plate C11 is closer to the active portion A than the first via hole V1, and the first electrode plate C11 is located below the first via hole V1. Different from the foregoing embodiments, this embodiment cancels the design of the third sub-portion 211 being above the first electrode plate C11, the step difference of the film layers is reduced through the second sub-portion 2412, and the entire first electrode plate C11 is on the side of the first via V1 proximate to the active portion A.

In some specific embodiments, the display substrate further includes the second reflective conductive layer 260, which is on a side of the first reflective conductive layer 270 away from the base substrate 200. The n$^{th}$ sub-pixel PX further includes a reflective portion 261 in the second reflective conductive layer 260. An orthographic projection of the reflection portion 261 on the base substrate 200 covers the orthographic projection of the second opening K2 on the base substrate 200 and the orthographic projection of the third opening K3 on the base substrate 200. The reflection portion 261 is further provided with a fourth opening K4, and an orthographic projection of the fourth opening K4 on the base substrate 200 covers the transmissive section TS. The reflective portion 261 is electrically connected to the first sub-portion 2411 at an edge of the fourth opening K4, In the embodiments of the present disclosure, the second reflective conductive layer 260 includes a metal material capable of reflecting light. A pattern of the reflective portion 261 is complementary to a pattern of the third electrode plate C13, that is, in the reflective section FS, a part exposed by the third electrode plate C13 may be covered by the reflection portion 261, and a part exposed by the reflection portion 261 may be covered by the third electrode plate C13, thereby increasing the reflective area.

In the embodiments of the present disclosure, the orthographic projection of the first opening K1 on the base substrate 200 covers the orthographic projection of the fourth opening K4 on the base substrate 200. In this way, a range of the transmissive section TS may be defined by the fourth opening K4.

In some specific embodiments, a size of the fourth opening K4 in the second direction X is greater than or equal to a size of the fourth opening K4 in the first direction Y. The fourth opening K4 has a horizontal strip-like structure. Alternatively, the fourth opening K4 has a square shape. Compared with the strip-like structure, the fourth opening K4 with a square structure may better alleviate the light leakage problem during the transmission display.

Referring to FIG. 29, in some specific embodiments, in addition to the above-mentioned first insulating layer 250, a respective insulating layer may be arranged between two adjacent film layers with conductive properties. For example, a second insulating layer 280 is arranged between the first conductive layer 220 and the semiconductor layer 210. The second insulating layer 280 may also be called a gate insulating layer. A planarization layer 290 may be arranged between the transparent conductive layer 240 and the second reflective conductive layer 260. The planarization layer 290 may include an organic material. The planarization layer 290 is used to reduce the step difference of the film layers, so as to keep the second reflective conductive layer 260 as flat as possible.

The first insulating layer 250 may include a composite structure of two insulating film layers. For example, the first insulating layer 250 includes a first spacing layer 251 and a second spacing layer 252. The first spacing layer 251 is between the first reflective conductive layer 270 and the second conductive layer 230, and the second spacing layer 252 is between the first reflective conductive layer 270 and the transparent conductive layer 240, and the first via hole V1 passes through the first spacing layer 251 and the second spacing layer 252.

A manufacturing process in the embodiments of the present disclosure are briefly described below.

First, the first conductive layer 220 is formed on the base substrate 200. The first conductive layer 220 includes the first electrode plate C11, the gate of a switching transistor T2, and the gate line GL. Compared with the foregoing embodiments, the line width of the gate line GL is reduced. After that, the second insulating layer 280 is formed on the first conductive layer 220, and the semiconductor layer 210 is formed on the second insulating layer 280, where the semiconductor layer 210 includes the active portion A. Further, the second conductive layer 230 is formed on the semiconductor layer 210, where the second conductive layer 230 includes the second electrode plate C12, the source and the drain of the switching transistor T2 and the data line DL. Compared with the foregoing embodiments, the line width of the data line DL is reduced. Next, the first spacing layer 251 is formed on the second conductive layer 230. Then, the first reflective conductive layer 270 is formed on the first spacing layer 251, where the first reflective conductive layer 270 includes the third electrode plate C13. After that, the second spacing layer 252 is formed on the first reflective conductive layer 270, and the first via hole V1 passing through the first spacing layer 251 and the second spacing layer 252 is formed. Then, the transparent conductive layer 240 is formed on the second spacing layer 252, where the transparent conductive layer 240 includes the transparent conductive portion 241, and the transparent conductive portion 241 is electrically connected to the second electrode plate C12 through the first via hole V1. Finally, the planarization layer 290 and the second reflective conductive layer 260 are formed on the transparent conductive layer 240, and the large hole V2 is formed in the planarization layer 290 at a position corresponding to the transmissive section TS. The second reflective conductive layer 260 is in contact with and connected to the transparent conductive portion 241 at the position of the large hole V2.

In the embodiments of the present disclosure, the third electrode plate C13 is arranged in the first reflective conductive layer 270. Compared with the solution that the third electrode plate C13 is arranged in the transparent conductive layer 240, the size of the third electrode plate C13 is not limited by the transparent conductive portion 241. Therefore, the design of the third electrode plate C13 is more flexible and the coverage area may be larger. In addition to increasing the capacitance of storage capacitor C and reducing the step difference of the film layers, the reflective area may also be increased, thereby improving the reflection effect.

General designs in the embodiments of the present disclosure that may be applied to each of the above embodiments may be described below.

Referring to FIGS. 2 and 11, in some specific embodiments, the display substrate further includes the display area and the peripheral area NA that at least partially surrounds the display area. The plurality of sub-pixels PX are provided in the display area. The display substrate further includes a plurality of first connection lines L1, a plurality of second connection lines L2 and at least one common signal line VCOM. The plurality of first connection lines L1 are arranged in the first direction Y, and the plurality of second connection lines L2 are arranged in the first direction Y. In the $n^{th}$ sub-pixel PX, the third electrode plate C13 is electrically connected to an $i^{th}$ first connection line L1, and the first electrode plate C11 is electrically connected to a $j^{th}$ second connection line L2. The $i^{th}$ first connection line L1 and the j-th second connection line L2 are electrically connected to the common signal line VCOM in the peripheral area NA. Each of i and j is a positive integer.

In the embodiments of the present disclosure, the common signal line VCOM is provided in the peripheral area NA, for example, the common signal line VCOM at least partially surrounds the display area AA. Optionally, the common signal line VCOM is provided in the first conductive layer 220.

Optionally, a gate drive circuit 21 is provided in the peripheral area NA. An orthographic projection of the common signal line VCOM on the base substrate 200 is between an orthographic projection of the display area AA on the base substrate 200 and an orthographic projection of the gate driver circuit 21 on the base substrate 200.

The first connection line L1 and the second connection line L2 extend in the second direction X. The common signal line VCOM and the first connection line L1 (or the second connection line L2) intersect with each other in the peripheral area NA, and at an intersection position, the common signal line VCOM and the first connection line L1 (or the second connection line L2) may be transferred through a connection hole.

Optionally, when the third electrode plate C13 is provided in the first reflective conductive layer 270, third electrode plates C13 in the plurality of sub-pixels PX may be formed as an integral structure. In addition to being electrically connected to the common signal line VCOM through the first connection line L1 extending in the second direction X, the third electrode plate C13 may also be electrically connected to the common signal line VCOM through a third connection line extending in the first direction Y.

In some specific embodiments, in the reflective section FS, a pattern of the orthographic projection of the active portion A on the base substrate 200 is complementary to a pattern of the orthographic projection of the third electrode plate C13 on the base substrate 200.

In the embodiments of the present disclosure, the pattern of the orthographic projection of the active portion A on the base substrate 200 is complementary to the pattern of the third electrode plate C13 on the base substrate 200 in the reflective section FS may refer to: except for a part of the reflective section FS which have to be exposed (such as the first via hole V1 and its periphery, and a periphery of the active portion A), the orthographic projections of the active portion A and the third electrode plate C13 on the base substrate 200 may cover the entire reflective section FS, so that the coverage area of the third electrode plate C13 may be increased as much as possible, so that the step difference of the film layers caused by the active portion A may be better reduced.

At least some embodiments of the present disclosure further provide a display panel including the display substrate as described above, and the display panel has the display area AA and the peripheral area NA and related structures therein. For example, the display panel may be a liquid crystal display panel.

Figure 30:
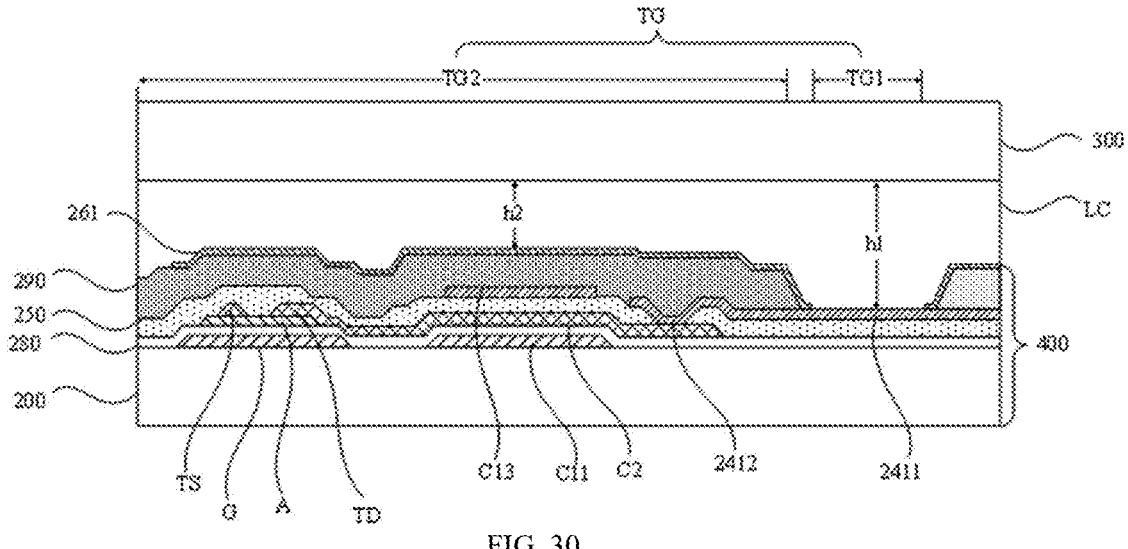
FIGS. 30 and 31 schematically show cross-sectional views of a display panel according to an embodiment of the present disclosure.
Figure 31:
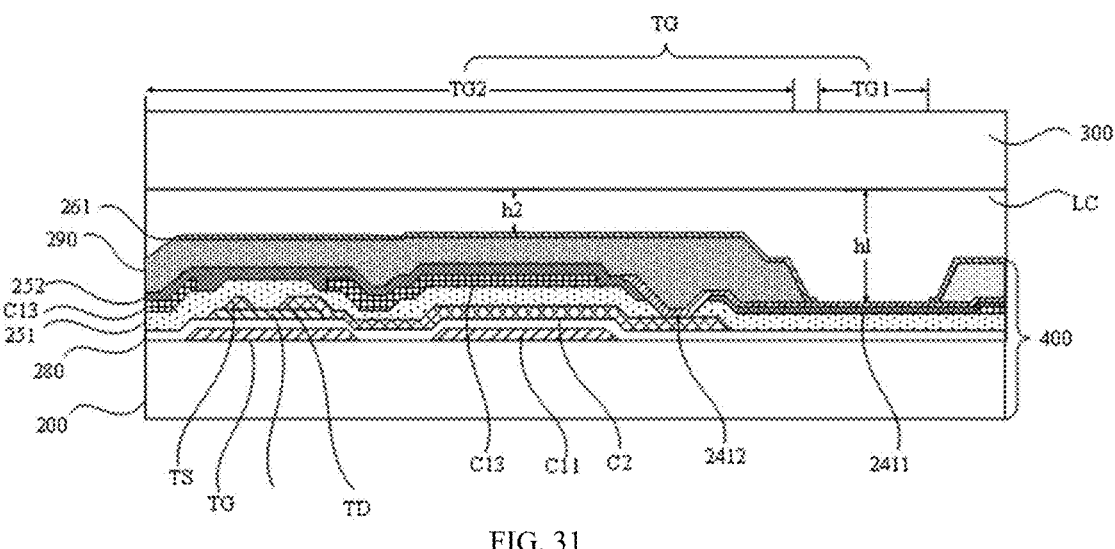
Figure 32:
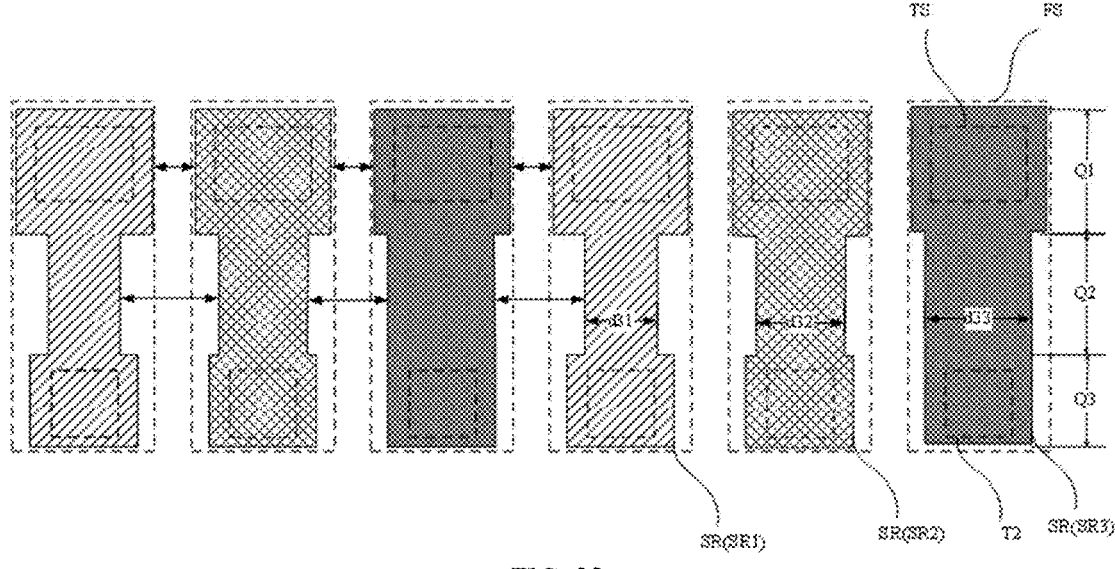
FIG. 32 schematically shows a top view of a color resistor according to an embodiment of the present disclosure.

FIGS. 30 and 31 schematically show cross-sectional views of a display panel according to embodiments of the present disclosure. FIG. 30 shows a display panel in which the third electrode plate is in the transparent conductive layer, and FIG. 31 shows a display panel in which a third electrode plate is in a first reflective conductive layer. FIG. 32 schematically shows a top view of a color resistor according to an embodiment of the present disclosure.

Referring to FIGS. 30 to 32, the display panel in the embodiments of the present disclosure includes a display substrate 400 and a counter substrate 300. The display substrate 400 includes the display substrate 400 in the foregoing embodiments. The counter substrate 300 includes a plurality of color resistors SR, and an $m^{th}$ color resistor SR is arranged to face the $n^{th}$ sub-pixel PX. The $m^{th}$ color resistor SR includes a first region Q1, a second region Q2 and a third region Q3. An orthographic projection of the first region Q1 on the base substrate 200 covers the orthographic projection of the transmissive section TS of the $n^{th}$ sub-pixel PX on the base substrate 200, and an orthographic projection of the third region Q3 on the base substrate 200 covers the orthographic projection of the active portion A of the $n^{th}$ sub-pixel PX on the base substrate 200. In the first direction Y, the second region Q2 is between the first region Q1 and the third region Q3. In the second direction X, a size of the second region Q2 is smaller than or equal to a size of the third region Q3. The second direction X and the first direction Y intersect with each other.

Optionally, the first direction Y may include a direction in which the data line DL extends on the display substrate, and the second direction X may include a direction in which the gate line GL extends on the display substrate. For example, referring to FIG. 2, the first direction Y may be the vertical direction in FIG. 2, and the second direction X may be the horizontal direction in FIG. 2, that is, the first direction and the second direction intersect with each other.

In the embodiments of the present disclosure, each color resistor SR allows light of one color to pass through, and different color resistors SR allow different light to pass through. For example, the plurality of color resistors SR allow red light, green light and blue light to pass through, respectively. The plurality of color resistors SR may be arranged in one-to-one correspondence with the plurality of sub-pixels PX, that is, each color resistor SR corresponds to one sub-pixel PX, and different sub-pixels PX correspond to different color resistors SR. The $n^{th}$ sub-pixel PX may refer to any sub-pixel PX in the plurality of sub-pixels PX, and the $m^{th}$ color resistor SR is a color resistor SR corresponding to this sub-pixel PX.

Referring to FIG. 32, the first region Q1 covers the transmissive section TS, the third region Q3 covers the switching transistor T2. The second region Q2 is between the first region Q1 and the third region Q3. The second region Q2 is narrower than the third region Q3, so as to increase an amount of incident environmental light during the reflective display, so that the effect of the reflection display may be improved.

In some specific embodiments, the plurality of color resistors SR include a first color resistor SR1, a second color resistor SR2, and a third color resistor SR3. The colors of the first color resistor SR1, the second color resistor SR2 and the third color resistor SR3 are different. An orthographic projection of the first color resistor SR1 on the base substrate 200, an orthographic projection of the second color resistor SR2 on the base substrate 200, and an orthographic projection of the third color resistor SR3 on the base substrate 200 are spaced apart from each other, so as to prevent optical crosstalk between the plurality of color resistors SR. For example, the first color resistor SR1 is a red color resistor, the second color resistor SR2 is a green color resistor, and the third color resistor SR3 is a blue color resistor.

In the second direction X, the second region Q2 of the first color resistor SR1 has a fourth size d31, the second region Q2 of the second color resistor has a fifth size d32, and the second region Q2 of the third color resistor has a sixth size d33. The fifth size d32 is greater than the fourth size d31 and is smaller than the sixth size d33. For example, the second region Q2 of the first color resistor SR1 is narrower than the second region Q2 of the second color resistor SR2, and the second region Q2 of the second color resistor is narrower than the second region Q2 of the third color resistor SR3.

In the embodiment of the present disclosure, the sizes of the second regions Q2 of different color resistors SR are different, so as to meet the needs of light input amounts of different colors of light.

It will be noted that the relationship between the sizes of the second regions Q2 in the plurality of color resistors SR in the embodiments of the present disclosure is not limited to the above example, and may be determined according to actual needs, which will not be listed one by one here.

In some specific embodiments, the display panel further includes a liquid crystal layer LC. The liquid crystal layer LC includes a plurality of dimming areas TG, and a $z^{th}$ dimming area TG is arranged to face the $n^{th}$ sub-pixel PX.

The $z^{th}$ dimming area TG includes a first dimming sub-area TG1 and a second dimming sub-area TG2. An orthographic projection of the first dimming sub-area TG1 on the base substrate 200 covers the orthographic projection of the transmissive section TS of the $n^{th}$ sub-pixel PX on the base substrate 200, and the orthographic projection of the second dimming sub-area TG2 on the base substrate 200 covers the orthographic projection of the reflective section FS of the $n^{th}$ sub-pixel PX on the base substrate 200. A cell thickness h1 of the first dimming sub-area TG1 is greater than a cell thickness h2 of the second dimming sub-area TG2.

In the embodiments of the present disclosure, a ratio of the cell thickness h1 of the first dimming sub-area TG1 to the cell thickness h2 of the second dimming sub-area TG2 may be set to 2:1. In this way, an optical distance of environmental light in the second dimming sub-area TG2 is a first optical distance during the reflective display, and an optical distance of the light emitted by the backlight module in the first dimming sub-area TG1 is a second optical distance during the transmission display. The first optical distance and the second optical distance are equal, so that the best transmission and reflection display effect may be achieved.

In the embodiments of the present disclosure, there is no black matrix provided in the color filter substrate, and the light shielding effect may be achieved by replacing the black matrix with structures such as the reflective portion 261, the third electrode plate C13, the data lines DL and the gate lines GL in the display substrate 400. Details may be referred to the foregoing embodiments, which will not be repeated here again.

At least some embodiments of the present disclosure further provide a display device. The display device may include any device or product with display functions. For example, the display device may be a smartphone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as head-worn device, electronic clothing, electronic bracelet, electronic necklace, electronic accessory, electronic tattoo, or smart watch), or a television, etc.

It will be understood that the display device according to the embodiment of the present disclosure has all the features and advantages of the above-mentioned display substrate and display panel. The details may refer to the above description, which will not be described again here.

What is claimed is:

1. A display substrate, comprising: a base substrate, a semiconductor layer, a first conductive layer and a second conductive layer, the second conductive layer being on a side of the first conductive layer away from the base substrate, wherein the display substrate further comprises a plurality of sub-pixels, and an $n^{th}$ sub-pixel of the plurality of sub-pixels comprises: a transmissive section and a reflective section outside the transmissive section;

wherein the $n^{th}$ sub-pixel further comprises: a storage capacitor and a switching transistor that are arranged in the reflective section;

wherein the storage capacitor comprises: a first electrode plate, a second electrode plate and a third electrode plate, the first electrode plate is in the first conductive layer, the second electrode plate is in the second conductive layer, the third electrode plate is on a side of the second conductive layer away from the base substrate, the first electrode plate is electrically connected to the third electrode plate, the second electrode plate is electrically connected to the switching transistor, and each of the first electrode plate and the third electrode plate is insulated and spaced apart from the second electrode plate;

wherein the switching transistor comprises an active portion arranged in the semiconductor layer;

wherein an orthographic projection of the first electrode plate on the base substrate overlaps with an orthographic projection of the second electrode plate on the base substrate, and the orthographic projection of the second electrode plate on the base substrate overlaps with an orthographic projection of the third electrode plate on the base substrate;

wherein an orthographic projection of the active portion on the base substrate is spaced apart from the orthographic projection of the third electrode plate on the base substrate, and the active portion has substantially a same thickness as the third electrode plate;

wherein n is a positive integer;

wherein the display substrate further comprises a transparent conductive layer and a first insulating layer, the transparent conductive layer is on a side of the second conductive layer away from the base substrate, and the first insulating layer is between the second conductive layer and the transparent conductive layer;

the third electrode plate is in the transparent conductive layer, and the nth sub-pixel further comprises a transparent conductive portion in the transparent conductive layer, and the transparent conductive portion is insulated and spaced apart from the third electrode plate;

the transparent conductive portion comprises a first sub-portion and a second sub-portion, and the first sub-portion and the second sub-portion are electrically connected;

the first insulating layer is provided with a first via hole passing through the first insulating layer, the first sub-portion is in the transmissive section, the second sub-portion is in the reflective section, an orthographic projection of the second sub-portion on the base substrate and the orthographic projection of the second electrode plate on the base substrate have an overlapping area, and the second sub-portion and the second electrode plate are electrically connected through the first via hole in the overlapping area; and the first electrode plate comprises a third sub-portion, an orthographic projection of the third sub-portion on the base substrate at least partially surrounds an orthographic projection of the first via hole on the base substrate, a part of the orthographic projection of the third sub-portion on the base substrate overlaps with the orthographic projection of the second sub-portion on the base substrate, and another part of the orthographic projection of the third sub-portion on the base substrate is spaced apart from the orthographic projection of the second sub-portion on the base substrate.

2. The display substrate according to claim 1, wherein the third sub-portion comprises: a first structure and a second structure;

an orthographic projection of the first sub-portion on the base substrate, an orthographic projection of the second sub-portion on the base substrate and an orthographic projection of the active portion on the base substrate are arranged in a first direction, and in a second direction, an orthographic projection of the first structure on the base substrate and an orthographic projection of the second structure on the base substrate are on opposite sides of the orthographic projection of the first via hole on the base substrate, respectively;

an orthographic projection of a part of the first structure proximate to the second structure on the base substrate overlaps with the orthographic projection of the second sub-portion on the base substrate, and an orthographic projection of a part of the first structure away from the second structure on the base substrate is spaced apart from the orthographic projection of the second sub-portion on the base substrate; and/or, an orthographic projection of a part of the second structure proximate to the first structure on the base substrate overlaps with the orthographic projection of the second sub-portion on the base substrate, and an orthographic projection of a part of the second structure away from the first structure on the base substrate is spaced apart from the orthographic projection of the second sub-portion on the base substrate; and the second direction and the first direction intersect with each other.

3. The display substrate according to claim 2, wherein in the first direction, any one of an orthographic projection of the first structure and an orthographic projection of the second structure on the base substrate has a first spacing from the orthographic projection of the first sub-portion on the base substrate, and the orthographic projection of the first via hole on the base substrate has a second spacing from the orthographic projection of the first sub-portion on the base substrate; and the first spacing is smaller than the second spacing.

4. The display substrate according to claim 1, wherein the transparent conductive portion further comprises a connecting sub-portion between the first sub-portion and the second sub-portion; and the orthographic projection of the second electrode plate on the base substrate overlaps with an orthographic projection of the connecting sub-portion on the base substrate.

5. The display substrate according to claim 2, wherein the first electrode plate further comprises a fourth sub-portion, an orthographic projection of the fourth sub-portion on the base substrate is between the orthographic projection of the second sub-portion on the base substrate and the orthographic projection of the active portion on the base substrate in the first direction, and the orthographic projection of the third sub-portion on the base substrate is on a side of the orthographic projection of the fourth sub-portion on the base substrate proximate to the orthographic projection of the second sub-portion on the base substrate; and the orthographic projection of the third electrode plate on the base substrate overlaps with the orthographic projection of the fourth sub-portion on the base substrate.

6. The display substrate according to claim 1, further comprising a plurality of data lines arranged in a second direction, an $x^{th}$ data line of the plurality of data lines is electrically connected to the $n^{th}$ sub-pixel, wherein in the $n^{th}$ sub-pixel, in the second direction, the orthographic projection of the third electrode plate on the base substrate has a third spacing from an orthographic projection of the $x^{th}$ data line on the base substrate, the orthographic projection of the third electrode plate on the base substrate has a fourth spacing from an orthographic projection of an $(x+1)^{th}$ data line on the base substrate, the orthographic projection of the second electrode plate on the base substrate has a fifth spacing from the orthographic projection of the $x^{th}$ data line on the base substrate, and the orthographic projection of the second electrode plate on the base substrate has a sixth spacing from the orthographic projection of the $(x+1)^{th}$ data line on the base substrate;

the third spacing is smaller than the fifth spacing, and the fourth spacing is smaller than the sixth spacing; and each of x and y is a positive integer.

7. The display substrate according to claim 6, wherein in the $n^{th}$ sub-pixel, in the second direction, the orthographic projection of the first electrode plate on the base substrate has a seventh spacing from the orthographic projection of the $x^{th}$ data line on the base substrate, and the orthographic projection of the first electrode plate on the base substrate has an eighth spacing from the orthographic projection of the $(x+1)^{th}$ data line on the base substrate; and the fifth spacing is greater than the seventh spacing, and the sixth spacing is greater than the eighth spacing.

8. The display substrate according to claim 6, wherein the orthographic projection of the third electrode plate on the base substrate and the orthographic projection of the active portion on the base substrate are arranged in a first direction, and in the first direction, the orthographic projection of the third electrode plate on the base substrate has a ninth spacing from the orthographic projection of the active portion on the base substrate;

the orthographic projection of the second electrode plate on the base substrate and the orthographic projection of the active portion on the base substrate are arranged in the first direction, and in the first direction, the orthographic projection of the second electrode plate on the base substrate has a tenth spacing from the orthographic projection of the active portion on the base substrate; and the first direction and the second direction intersect with each other, and the ninth spacing is greater than the tenth spacing.

9. The display substrate according to claim 8, wherein the orthographic projection of the first electrode plate on the base substrate and the orthographic projection of the active portion on the base substrate are arranged in the first direction, and in the first direction, the orthographic projection of the first electrode plate on the base substrate has an eleventh spacing from the orthographic projection of the active portion on the base substrate, and the ninth spacing is smaller than the eleventh spacing.

10. The display substrate according to claim 1, wherein the display substrate further comprises a second reflective conductive layer, the second reflective conductive layer is on a side of the transparent conductive layer away from the base substrate;

the $n^{th}$ sub-pixel further comprises a reflective portion in the second reflective conductive layer, and the reflective portion is provided with a fourth opening; and an orthographic projection of the reflective portion on the base substrate at least covers an orthographic projection of the active portion on the base substrate and an orthographic projection of the third electrode plate on the base substrate, and an orthographic projection of the fourth opening on the base substrate covers an orthographic projection of the first sub-portion on the base substrate.

11. The display substrate according to claim 1, wherein the display substrate further comprises a first reflective conductive layer on a side of the second conductive layer away from the base substrate, and the third electrode plate is provided in the first reflective conductive layer;

the display substrate further comprises a plurality of data lines and a plurality of gate lines, the plurality of data lines are arranged in a second direction, the plurality of gate lines are arranged in a first direction, and the first direction and the second direction intersect with each other;

an $x^{th}$ data line of the plurality of data lines is electrically connected to the $n^{th}$ sub-pixel, and a $y^{th}$ gate line of the plurality of gate lines is electrically connected to the $n^{th}$ sub-pixel;

an orthographic projection of at least one of the $x^{th}$ data line, an $(x+1)^{th}$ data line, a $(y-1)^{th}$ gate line, and the $y^{th}$ gate line on the base substrate overlaps with an orthographic projection of the third electrode plate of the $n^{th}$ sub-pixel on the base substrate; and each of x and y is a positive integer.

12. The display substrate according to claim 11, wherein the display substrate further comprises a transparent conductive layer and a first insulating layer, the transparent conductive layer is on a side of the first reflective conductive layer away from the base substrate, and the first insulating layer is between the second conductive layer and the transparent conductive layer; and the $n^{th}$ sub-pixel further comprises a transparent conductive portion, and the transparent conductive portion is provided in the transparent conductive layer, wherein the transparent conductive portion comprises a first sub-portion and a second sub-portion that are electrically connected;

the first insulating layer is provided with a first via hole passing through the first insulating layer, the first sub-portion is in the transmissive section, the second sub-portion is in the reflective section, an orthographic projection of the second sub-portion on the base substrate and the orthographic projection of the second electrode plate on the base substrate have an overlapping area, and the second sub-portion and the second electrode plate are electrically connected through the first via hole in the overlapping area; and the third electrode plate is provided with a first opening and a second opening, an orthographic projection of the first opening on the base substrate covers an orthographic projection of the transmissive section on the base substrate, and an orthographic projection of the second opening on the base substrate covers an orthographic projection of the first via hole on the base substrate.

13. The display substrate according to claim 12, wherein the third electrode plate is further provided with a third opening, and an orthographic projection of the third opening on the base substrate covers the orthographic projection of the active portion on the base substrate;

in the second direction, the first opening has a first size, the second opening has a second size, and the third opening has a third size; and the third size is smaller than the first size and is greater than the second size.

14. The display substrate according to claim 12, wherein an orthographic projection of the first electrode plate on the base substrate overlaps with an orthographic projection of the second sub-portion on the base substrate, and the orthographic projection of the first electrode plate on the base substrate is on a side of the orthographic projection of the first via hole on the base substrate away from the first sub-portion;

wherein the first sub-portion and the second sub-portion have substantially a same size in the second direction.

15. The display substrate according to claim 13, wherein the display substrate further comprises a second reflective conductive layer, the second reflective conductive layer is on the side of the first reflective conductive layer away from the base substrate;

the $n^{th}$ sub-pixel further comprises a reflective portion in the second reflective conductive layer, an orthographic projection of the reflective portion on the base substrate covers an orthographic projection of the second opening on the base substrate and an orthographic projection of the third opening on the base substrate, the reflective portion is further provided with a fourth opening, and an orthographic projection of the fourth opening on the base substrate covers the transmissive section; and the reflective portion is electrically connected to the first sub-portion at an edge of the fourth opening;

wherein a size of the fourth opening in the second direction is greater than or equal to a size of the fourth opening in the first direction.

16. The display substrate according to claim 1, wherein the display substrate further comprises a display area and a peripheral area at least partially surrounding the display area, the plurality of sub-pixels are provided in the display area;

the display substrate further comprises a plurality of first connection lines, a plurality of second connection lines and at least one common signal line, the plurality of first connection lines are arranged in the first direction, and the plurality of second connection lines are arranged in the first direction;

in the $n^{th}$ sub-pixel, the third electrode plate is electrically connected to an $i^{th}$ first connection line of the plurality of first connection lines, and the first electrode plate is electrically connected to a $j^{th}$ second connection line of the plurality of second connection lines, and the $i^{th}$ first connection line and the $j^{th}$ second connection line are electrically connected to the common signal line in the peripheral area;

each of i and j is a positive integer;

wherein in the reflective section, a pattern of the orthographic projection of the active portion on the base substrate is complementary to a pattern of the orthographic projection of the third electrode plate on the base substrate.

17. A display panel, comprising a display substrate and a counter substrate, wherein the display substrate comprises the display substrate according to claim 1, the counter substrate comprises a plurality of color resistors, and an $m^{th}$ color resistor of the plurality of color resistors is arranged to face the $n^{th}$ sub-pixel;

an $m^{th}$ color resistor of the plurality of color resistors comprises a first region, a second region and a third region, an orthographic projection of the first region on the base substrate covers an orthographic projection of the transmissive section of the $n^{th}$ sub-pixel on the base substrate, an orthographic projection of the third region on the base substrate covers an orthographic projection of the active portion of the $n^{th}$ sub-pixel on the base substrate, and in a first direction, the second region is between the first region and the third region;

a size of the second region is smaller than or equal to a size of the third region in a second direction, and the second direction and the first direction intersect with each other; and m is a positive integer.

18. The display panel according to claim 17, wherein the plurality of color resistors comprise a first color resistor, a second color resistor and a third color resistor, the first color resistor, the second color resistor and the third color resistor have different colors, an orthographic projection of the first color resistor on the base substrate, an orthographic projection of the second color resistor on the base substrate and an orthographic projection of the third color resistor on the base substrate are spaced apart from each other; and in the second direction, a second region of the first color resistor has a fourth size, a second region of the second color resistor has a fifth size, a second region of the third color resistor has a sixth size, and the fifth size is greater than the fourth size and is smaller than the sixth size;

wherein the display panel further comprises a liquid crystal layer, wherein the liquid crystal layer comprises a plurality of dimming areas, and a zth dimming area of the plurality of dimming areas is arranged to face the nth sub-pixel; and the zth dimming area comprises a first dimming sub-area and a second dimming sub-area, an orthographic projection of the first dimming sub-area on the base substrate covers an orthographic projection of the transmissive section of the nth sub-pixel on the base substrate, an orthographic projection of the second dimming sub-area on the base substrate covers an orthographic projection of the reflective section of the nth sub-pixel on the base substrate, and a cell thickness of the first dimming sub-area is greater than a cell thickness of the second dimming sub-area.

19. A display device, comprising the display panel according to claim 17.

* * * * *